United States Patent
McLaurin et al.

(10) Patent No.: US 10,693,279 B1
(45) Date of Patent: Jun. 23, 2020

(54) SEMICONDUCTOR LASER DIODE ON TILED GALLIUM CONTAINING MATERIAL

(71) Applicant: Soraa Laser Diode, Inc., Goleta, CA (US)

(72) Inventors: Melvin McLaurin, Santa Barbara, CA (US); Alexander Sztein, Santa Barbara, CA (US); Po Shan Hsu, Arcadia, CA (US); James W. Raring, Santa Barbara, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

(21) Appl. No.: 16/556,081

(22) Filed: Aug. 29, 2019

Related U.S. Application Data

(60) Continuation of application No. 16/032,997, filed on Jul. 11, 2018, now Pat. No. 10,431,958, which is a
(Continued)

(51) Int. Cl.
*H01L 29/20* (2006.01)
*H01S 5/02* (2006.01)
(Continued)

(52) U.S. Cl.
CPC ...... *H01S 5/34333* (2013.01); *H01L 29/2003* (2013.01); *H01S 5/00* (2013.01);
(Continued)

(58) Field of Classification Search
CPC ........ H01S 5/00; H01S 5/0216; H01S 5/0282; H01S 5/0215; H01S 5/0224;
(Continued)

(56) References Cited

U.S. PATENT DOCUMENTS

| 4,341,592 A | 7/1982 | Shortes et al. |
| 4,860,687 A | 8/1989 | Frijlink |

(Continued)

FOREIGN PATENT DOCUMENTS

| CN | 104836117 | 8/2015 |
| CN | 104836118 | 8/2015 |

(Continued)

OTHER PUBLICATIONS

Power electronics, Retrieved from the internet: http://en.wikipedia.org/wiki/Power_electronics, Dec. 31, 2014, 24 pages.
(Continued)

*Primary Examiner* — Tuan N Nguyen

(74) *Attorney, Agent, or Firm* — Kilpatrick Townsend & Stockton LLP

(57) ABSTRACT

In an example, the present invention provides a gallium and nitrogen containing structure. The structure has a plurality of gallium and nitrogen containing semiconductor substrates, each of the gallium and nitrogen containing semiconductor substrates having one or more epitaxially grown layers. The structure has a first handle substrate coupled to each of the substrates. The orientation of a reference crystal direction for each of the substrates are parallel to within 10 degrees or less. The structure has a first bonding medium provided between the first handle substrate and each of the substrates.

5 Claims, 12 Drawing Sheets

Related U.S. Application Data continuation of application No. 15/682,148, filed on Aug. 21, 2017, now Pat. No. 10,044,170, which is a continuation of application No. 15/218,690, filed on Jul. 25, 2016, now Pat. No. 9,762,032, which is a continuation of application No. 14/931,743, filed on Nov. 3, 2015, now Pat. No. 9,401,584, which is a division of application No. 14/175,622, filed on Feb. 7, 2014, now Pat. No. 9,209,596.

(51) Int. Cl.

| | | |
|---|---|---|
| *H01S 5/00* | (2006.01) | |
| *H01S 5/022* | (2006.01) | |
| *H01L 33/16* | (2010.01) | |
| *H01L 23/00* | (2006.01) | |
| *H01L 33/50* | (2010.01) | |
| *H01S 5/343* | (2006.01) | |
| *H01S 5/32* | (2006.01) | |
| *H01S 5/028* | (2006.01) | |
| *H01S 5/042* | (2006.01) | |
| *H01S 5/22* | (2006.01) | |

(52) U.S. Cl.
CPC ............ *H01S 5/0206* (2013.01); *H01S 5/028* (2013.01); *H01S 5/0215* (2013.01); *H01S 5/0216* (2013.01); *H01S 5/0282* (2013.01); *H01S 5/0421* (2013.01); *H01S 5/0425* (2013.01); *H01S 5/22* (2013.01); *H01S 5/2201* (2013.01); *H01S 5/3202* (2013.01); *H01L 24/29* (2013.01); *H01L 33/16* (2013.01); *H01L 33/50* (2013.01); *H01S 5/0202* (2013.01); *H01S 5/0217* (2013.01); *H01S 5/0224* (2013.01)

(58) Field of Classification Search
CPC ........ H01S 5/0206; H01S 5/042; H01S 5/022; H01S 5/32; H01L 21/68; H01L 29/2003; H01L 33/16
USPC ........................................ 372/44.01
See application file for complete search history.

(56) References Cited

U.S. PATENT DOCUMENTS

| | | |
|---|---|---|
| 4,911,102 A | 3/1990 | Manabe et al. |
| 5,331,654 A | 7/1994 | Jewell et al. |
| 5,334,277 A | 8/1994 | Nakamura |
| 5,366,953 A | 11/1994 | Char et al. |
| 5,474,021 A | 12/1995 | Tsuno et al. |
| 5,527,417 A | 6/1996 | Iida et al. |
| 5,562,127 A | 10/1996 | Fanselow et al. |
| 5,607,899 A | 3/1997 | Yoshida et al. |
| 5,632,812 A | 5/1997 | Hirabayashi |
| 5,696,389 A | 12/1997 | Ishikawa et al. |
| 5,821,555 A | 10/1998 | Saito et al. |
| 5,888,907 A | 3/1999 | Tomoyasu et al. |
| 5,926,493 A | 7/1999 | O'Brien et al. |
| 5,951,923 A | 9/1999 | Horie et al. |
| 5,985,687 A | 11/1999 | Bowers et al. |
| 6,069,394 A | 5/2000 | Hashimoto et al. |
| 6,147,953 A | 11/2000 | Duncan |
| 6,153,010 A | 11/2000 | Kiyoku et al. |
| 6,239,454 B1 | 5/2001 | Glew et al. |
| 6,379,985 B1 | 4/2002 | Cervantes et al. |
| 6,451,157 B1 | 9/2002 | Hubacek |
| 6,489,636 B1 | 12/2002 | Goetz et al. |
| 6,562,127 B1 | 5/2003 | Kud et al. |
| 6,586,762 B2 | 7/2003 | Kozaki |
| 6,635,904 B2 | 10/2003 | Goetz et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,920,166 B2 | 7/2005 | Akasaka et al. |
| 7,009,199 B2 | 3/2006 | Hall |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,489,441 B2 | 2/2009 | Scheible et al. |
| 7,555,025 B2 | 6/2009 | Yoshida |
| 7,691,658 B2 | 4/2010 | Kaeding et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 9/2011 | Okamoto et al. |
| 8,044,412 B2 | 10/2011 | Murphy et al. |
| 8,143,148 B1 | 3/2012 | Raring et al. |
| 8,247,887 B1 | 8/2012 | Raring et al. |
| 8,252,662 B1 | 8/2012 | Poblenz et al. |
| 8,259,769 B1 | 9/2012 | Raring et al. |
| 8,314,429 B1 | 11/2012 | Raring et al. |
| 8,351,478 B2 | 1/2013 | Raring et al. |
| 8,355,418 B2 | 1/2013 | Raring et al. |
| 8,422,525 B1 | 4/2013 | Raring et al. |
| 9,209,596 B1 | 12/2015 | McLaurin et al. |
| 9,246,311 B1 | 1/2016 | Raring et al. |
| 9,362,715 B2 | 6/2016 | Sztein et al. |
| 9,368,939 B2 | 6/2016 | McLaurin et al. |
| 9,379,525 B2 | 6/2016 | McLaurin et al. |
| 9,401,584 B1 | 7/2016 | McLaurin et al. |
| 9,520,697 B2 | 12/2016 | Steigerwald et al. |
| 9,711,949 B1 | 7/2017 | Raring et al. |
| 9,762,032 B1 | 9/2017 | McLaurin et al. |
| 10,044,170 B1 | 8/2018 | McLaurin et al. |
| 10,431,958 B1 | 10/2019 | McLaurin et al. |
| 2002/0050488 A1 | 5/2002 | Nikitin et al. |
| 2002/0085603 A1 | 7/2002 | Okumura |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0140846 A1 | 7/2003 | Biwa et al. |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0104391 A1 | 6/2004 | Maeda et al. |
| 2004/0112866 A1 | 6/2004 | Maleville et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0247275 A1 | 12/2004 | Vakhshoori et al. |
| 2004/0259331 A1* | 12/2004 | Ogihara ............ H01L 21/2007 438/462 |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0158896 A1 | 7/2005 | Hayashi et al. |
| 2005/0168564 A1 | 8/2005 | Kawaguchi et al. |
| 2005/0199893 A1 | 9/2005 | Lan et al. |

(56) References Cited

U.S. PATENT DOCUMENTS

| | | |
|---|---|---|
| 2005/0224826 A1 | 10/2005 | Keuper et al. |
| 2005/0229855 A1 | 10/2005 | Raaijmakers |
| 2005/0285128 A1 | 12/2005 | Scherer et al. |
| 2006/0030738 A1 | 2/2006 | Vanmaele et al. |
| 2006/0037529 A1 | 2/2006 | D'Evelyn et al. |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0110926 A1* | 5/2006 | Hu .................... B82Y 20/00 438/708 |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0109463 A1 | 5/2007 | Hutchins |
| 2007/0110112 A1 | 5/2007 | Sugiura |
| 2007/0120141 A1 | 5/2007 | Moustakas et al. |
| 2007/0163490 A1 | 7/2007 | Habel et al. |
| 2007/0166853 A1 | 7/2007 | Guenther et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0280320 A1 | 12/2007 | Feezell et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0138919 A1 | 6/2008 | Mueller et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0219309 A1 | 9/2008 | Hata et al. |
| 2008/0232416 A1 | 9/2008 | Okamoto et al. |
| 2008/0285609 A1 | 11/2008 | Ohta et al. |
| 2008/0291961 A1 | 11/2008 | Kamikawa et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0058532 A1 | 3/2009 | Kikkawa et al. |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0159869 A1 | 6/2009 | Ponce et al. |
| 2009/0173957 A1 | 7/2009 | Brunner et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0291518 A1 | 11/2009 | Kim et al. |
| 2009/0298265 A1 | 12/2009 | Fujiwara |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0044022 A1 | 2/2011 | Ko et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0075694 A1 | 3/2011 | Yoshizumi et al. |
| 2011/0103418 A1 | 5/2011 | Hardy et al. |
| 2011/0133489 A1 | 6/2011 | Hemeury et al. |
| 2011/0164637 A1 | 7/2011 | Yoshizumi et al. |
| 2011/0164646 A1* | 7/2011 | Maeda ................ H01S 5/0217 372/50.11 |
| 2011/0180781 A1 | 7/2011 | Raring et al. |
| 2011/0186874 A1 | 8/2011 | Shum |
| 2011/0186887 A1 | 8/2011 | Trottier et al. |
| 2011/0216795 A1 | 9/2011 | Hsu et al. |
| 2011/0233587 A1 | 9/2011 | Unno |
| 2011/0247556 A1 | 10/2011 | Raring et al. |
| 2012/0178198 A1 | 7/2012 | Raring et al. |
| 2012/0187412 A1 | 7/2012 | D'Evelyn et al. |
| 2012/0314398 A1* | 12/2012 | Raring ................ H01S 5/2201 362/84 |
| 2013/0214284 A1 | 8/2013 | Holder et al. |
| 2013/0234111 A1 | 9/2013 | Pfister et al. |
| 2015/0111325 A1* | 4/2015 | Hsu ..................... H01S 5/0217 438/27 |
| 2015/0140710 A1 | 5/2015 | McLaurin et al. |
| 2015/0229100 A1 | 8/2015 | Sztein et al. |
| 2015/0229107 A1 | 8/2015 | McLaurin et al. |
| 2015/0229108 A1 | 8/2015 | Steigerwald et al. |
| 2016/0372893 A1 | 12/2016 | McLaurin et al. |

FOREIGN PATENT DOCUMENTS

| | | |
|---|---|---|
| CN | 204793617 | 11/2015 |
| CN | 106165218 | 11/2016 |
| DE | 102014223196 | 8/2015 |
| EP | 3105829 | 12/2016 |
| JP | 2007068398 | 3/2007 |
| JP | 2007173467 | 7/2007 |
| KR | 1020160121558 | 10/2016 |
| WO | 2008041521 | 4/2008 |
| WO | 2015120118 | 8/2015 |

OTHER PUBLICATIONS

Transistor, Retrieved from http://en.wikipedia.org/wiki/Transistor, Dec. 31, 2014, 24 pages.

U.S. Appl. No. 12/481,543, Non-Final Office Action dated Jun. 27, 2011, 10 pages.

U.S. Appl. No. 12/482,440, Final Office Action dated Aug. 12, 2011, 7 pages.

U.S. Appl. No. 12/482,440, Non-Final Office Action dated Feb. 23, 2011, 6 pages.

U.S. Appl. No. 12/484,924, Final Office Action dated Oct. 31, 2011, 11 pages.

U.S. Appl. No. 12/484,924, Non-Final Office Action dated Apr. 14, 2011, 12 pages.

(56) References Cited

OTHER PUBLICATIONS

U.S. Appl. No. 12/491,169, Final Office Action dated May 11, 2011, 10 pages.
U.S. Appl. No. 12/491,169, Non-Final Office Action dated Oct. 22, 2010, 10 pages.
U.S. Appl. No. 12/497,289, Non-Final Office Action dated Feb. 2, 2012, 7 pages.
U.S. Appl. No. 12/497,289, Notice of Allowance dated May 22, 2012, 7 pages.
U.S. Appl. No. 12/502,058, Final Office Action dated Aug. 19, 2011, 13 pages.
U.S. Appl. No. 12/502,058, Non-Final Office Action dated Dec. 8, 2010, 15 pages.
U.S. Appl. No. 12/502,058, Notice of Allowance dated Apr. 16, 2012, 10 pages.
U.S. Appl. No. 12/534,829, Non-Final Office Action dated Apr. 19, 2011, 9 pages.
U.S. Appl. No. 12/534,829, Notice of Allowance dated Dec. 5, 2011, 10 pages.
U.S. Appl. No. 12/534,829, Notice of Allowance dated Dec. 21, 2011, 4 pages.
U.S. Appl. No. 12/534,829, Notice of Allowance dated Oct. 28, 2011, 8 pages.
U.S. Appl. No. 12/573,820, Final Office Action dated Oct. 11, 2011, 23 pages.
U.S. Appl. No. 12/573,820, Non-Final Office Action dated Mar. 2, 2011, 19 pages.
U.S. Appl. No. 12/573,820, filed Oct. 5, 2009, 32 pages.
U.S. Appl. No. 12/727,148, filed Mar. 18, 2010, 41 pages.
U.S. Appl. No. 12/749,466, Final Office Action dated Feb. 3, 2012, 16 pages.
U.S. Appl. No. 12/749,466, Non-Final Office Action dated Jun. 29, 2011, 20 pages.
U.S. Appl. No. 12/749,476, Final Office Action dated Nov. 8, 2011, 11 pages.
U.S. Appl. No. 12/749,476, Non-Final Office Action dated Apr. 11, 2011, 15 pages.
U.S. Appl. No. 12/749,476, Notice of Allowance dated May 4, 2012, 8 pages.
U.S. Appl. No. 12/759,273, Non-Final Office Action dated Nov. 21, 2011, 10 pages.
U.S. Appl. No. 12/762,269, Non-Final Office Action dated Oct. 12, 2011, 12 pages.
U.S. Appl. No. 12/762,269, Notice of Allowance dated Apr. 23, 2012, 8 pages.
U.S. Appl. No. 12/762,271, Final Office Action dated Jun. 6, 2012, 13 pages.
U.S. Appl. No. 12/762,271, Non-Final Office Action dated Dec. 23, 2011, 12 pages.
U.S. Appl. No. 12/762,278, Notice of Allowance dated Nov. 7, 2011, 11 pages.
U.S. Appl. No. 12/778,718, Non-Final Office Action dated Nov. 25, 2011, 12 pages.
U.S. Appl. No. 12/778,718, Notice of Allowance dated Apr. 3, 2012, 14 pages.
U.S. Appl. No. 12/778,718, Notice of Allowance dated Jun. 13, 2012, 7 pages.
U.S. Appl. No. 12/868,441, Non-Final Office Action dated Apr. 30, 2012, 12 pages.
U.S. Appl. No. 12/873,820, Non-Final Office Action dated Oct. 4, 2012, 10 pages.
U.S. Appl. No. 12/880,803, Non-Final Office Action dated Feb. 22, 2012, 9 pages.
U.S. Appl. No. 12/880,889, filed Sep. 13, 2010, 18 pages.
U.S. Appl. No. 12/883,093, Final Office Action dated Aug. 3, 2012, 13 pages.
U.S. Appl. No. 12/883,093, Non-Final Office Action dated Mar. 13, 2012, 12 pages.
U.S. Appl. No. 12/883,093, Notice of Allowance dated Nov. 21, 2012, 12 pages.
U.S. Appl. No. 12/883,652, Non-Final Office Action dated Apr. 17, 2012, 8 pages.
U.S. Appl. No. 12/884,993, Final Office Action dated Aug. 2, 2012, 15 pages.
U.S. Appl. No. 12/884,993, Non-Final Office Action dated Mar. 16, 2012, 15 pages.
U.S. Appl. No. 12/884,993, Notice of Allowance dated Nov. 26, 2012, 11 pages.
U.S. Appl. No. 13/014,622, Final Office Action dated Apr. 30, 2012, 14 pages.
U.S. Appl. No. 13/014,622, Non-Final Office Action dated Nov. 28, 2011, 14 pages.
U.S. Appl. No. 13/046,565, Final Office Action dated Feb. 2, 2012, 17 pages.
U.S. Appl. No. 13/046,565, Non-Final Office Action dated Nov. 7, 2011, 17 pages.
U.S. Appl. No. 13/046,565, Non-Final Office Action dated Apr. 13, 2012, 40 pages.
U.S. Appl. No. 14/175,622, Non-Final Office Action dated Apr. 27, 2015, 13 pages.
U.S. Appl. No. 14/175,622, Notice of Allowance dated Aug. 10, 2015, 9 pages.
U.S. Appl. No. 14/175,622, Restriction Requirement dated Feb. 10, 2015, 8 pages.
U.S. Appl. No. 14/176,403, Non-Final Office Action dated Sep. 11, 2015, 13 pages.
U.S. Appl. No. 14/176,403, Notice of Allowance dated Feb. 12, 2016, 8 pages.
U.S. Appl. No. 14/312,427, Final Office Action dated Dec. 16, 2015, 18 pages.
U.S. Appl. No. 14/312,427, Non-Final Office Action dated Aug. 21, 2015, 13 pages.
U.S. Appl. No. 14/312,427, Notice of Allowance dated Mar. 4, 2016, 8 pages.
U.S. Appl. No. 14/312,427, Restriction Requirement dated May 18, 2015, 7 pages.
U.S. Appl. No. 14/480,398, Non-Final Office Action dated Mar. 17, 2016, 17 pages.
U.S. Appl. No. 14/480,398, Restriction Requirement dated Oct. 22, 2015, 5 pages.
U.S. Appl. No. 14/534,636, Non-Final Office Action dated Jun. 3, 2015, 9 pages.
U.S. Appl. No. 14/534,636, Notice of Allowance dated Sep. 15, 2015, 11 pages.
U.S. Appl. No. 14/559,149, Notice of Allowance dated Feb. 17, 2016, 10 pages.
U.S. Appl. No. 14/559,149, Restriction Requirement dated Oct. 29, 2015, 6 pages.
U.S. Appl. No. 14/600,506, Non-Final Office Action dated Mar. 8, 2016, 7 pages.
U.S. Appl. No. 14/600,506, Notice of Allowance dated Aug. 9, 2016, 8 pages.
U.S. Appl. No. 14/600,506, Restriction Requirement dated Nov. 25, 2015, 6 pages.
U.S. Appl. No. 14/931,743, Notice of Allowance dated Mar. 31, 2016, 10 pages.
U.S. Appl. No. 15/218,690, Non-Final Office Action dated Feb. 7, 2017, 9 pages.
U.S. Appl. No. 15/218,690, Notice of Allowance dated May 11, 2017, 10 pages.
U.S. Appl. No. 15/559,149 filed, Jun. 9, 2016, 38 pages.
U.S. Appl. No. 15/682,148 Notice of Allowance dated Apr. 11, 2018, 11 pages.
U.S. Appl. No. 16/032,997 Notice of Allowance dated May 2, 2019, 15 pages.
U.S. Appl. No. 61/164,409 filed, Mar. 28, 2009, 23 pages.
U.S. Appl. No. 61/182,105, filed May 29, 2009, 10 pages
U.S. Appl. No. 61/249,568, filed Oct. 7, 2009, 62 pages.
Abare et al., Cleaved and Etched Facet Nitride Laser Diodes, IEEE Journal of Selected Topics in Quantum Electronics, vol. 4, No. 3, May 1998, pp. 505-509.

(56) References Cited

OTHER PUBLICATIONS

Amano et al., P-type conduction in Mg-doped GaN treated with low-energy electron beam irradiation (LEEBI), Japanese Journal of Applied Physics, vol. 28, No. 12, Dec. 1989, pp. L2112-L2114.
Aoki et al., InGaAs/InGaAsP MQW electroabsorption modulator integrated with a DFB laser fabricated by band-gap energy control selective area MOCVD, IEEE Journal of Quantum Electronics, vol. 29, No. 6, Jun. 1993, pp. 2088-2096.
Asano et al., 100-mW kink-free blue-violet laser diodes with low aspect ratio, IEEE Journal of Quantum Electronics, vol. 39, No. 1, Jan. 2003, pp. 135-140.
Bernardini et al., Spontaneous polarization and piezoelectric constants of III-V nitrides, Physical Review B, vol. 56, No. 16, Oct. 15, 1997, pp. 10024-10027.
Caneau et al., Studies on the selective OMVPE of (Ga,In)/(As,P), Journal of Crystal Growth, vol. 124, Nov. 1, 1992, pp. 243-248.
Chen et al., Growth and Optical Properties of Highly Uniform and Periodic InGaN Nanostructures, Advanced Materials, vol. 19, Jun. 5, 2007, pp. 1707-1710.
Chinese Application No. 201520095427.4, Office Action dated Apr. 29, 2015, 2 pages.
Chinese Application No. 201520095428.9, Office Action dated Apr. 29, 2015, 2 pages.
Chinese Application No. 201520096855.9, Office Action dated Apr. 27, 2015, 2 pages.
Chinese Application No. 201520096866.7, Office Action dated Apr. 29, 2015, 1 page.
Chinese Application No. 201520758768.5, Office Action dated Mar. 23, 2016, 2 pages.
Chinese Application No. 201520826757.6, Office Action dated Mar. 3, 2016, 3 pages (2 pages of English translation and 1 page of Original document).
D'Evelyn et al., Bulk GaN crystal growth by the high-pressure ammonothermal method, Journal of Crystal Growth, vol. 300, No. 1, Mar. 1, 2007, pp. 11-16.
Founta et al., Anisotropic Morphology of Nonpolar a-Plan GaN Quantum Dots and Quantum Wells, Journal of Applied Physics, vol. 102, No. 7, 2007, pp. 074304-1-074304-6.
Fujii et al., Increase in the extraction efficiency of GaN-based light-emitting diodes via surface roughening, Applied Physics Letters, vol. 84, No. 6, 2004, pp. 855-857.
Funato et al., Blue, Green, and Amber InGaN/GaN Light-Emitting Diodes on Semipolar {1122} GaN Bulk Substrates, Journal of Japanese Applied Physics, vol. 45, No. 26, 2006, pp. L659-L662.
Funato et al., Monolithic Polychromatic Light-Emitting Diodes Based on InGaN Microfacet Quantum Wells toward Tailor-Made Solid-State Lighting, Applied Physics Express, vol. 1, No. 1, 2008, pp. 011106-1-011106-3.
Gardner et al., Blue-emitting InGaN—GaN double-heterostructure light-emitting diodes reaching maximum quantum efficiency above 200A/cm2, Applied Physics Letters, vol. 91, Dec. 12, 2007, pp. 243506-1-243506-3.
Hiramatsu et al., Selective Area Growth and Epitaxial Lateral Overgrowth of GaN by Metalorganic Vapor Phase Epitaxy and Hydride Vapor Phase Epitaxy, Materials Science and Engineering B, vol. 59, May 6, 1999, pp. 104-111.
Hjort, Sacrificial etching of III-V compounds for micromechanical devices, J. Micromech. Miroeng., vol. 6, 1996, pp. 370-375.
Holder et al., Demonstration of Nonpolar GaN-Based Vertical-Cavity Surface-Emitting Lasers, Appl. Phys. Express, vol. 5, No. 9, 2012, pp. 092104-1-092104-3.
Iso et al., High Brightness Blue InGaN/GaN Light Emitting Diode on Nonpolar m-plane Bulk GaN Substrate, Japanese Journal of Applied Physics, vol. 46, No. 40, 2007, pp. L960-L962.
Kendall et al., Energy Savings Potential of Solid State Lighting in General Lighting Applications, Report for the Department of Energy, 2001, 35 pages.
Khan et al., Cleaved Cavity Optically Pumped InGaN—GaN Laser Grown on Spinel Substrates, Applied Physics Letters, vol. 69, No. 16, Oct. 14, 1996, pp. 2418-2420.

Kim et al., Improved Electroluminescence on Nonpolar m-plane InGaN/GaN Qantum Well LEDs, Physica Status Solidi (RRL), vol. 1, No. 3, 2007, pp. 125-127.
Kuramoto et al., Novel Ridge-Type InGaN Multiple-Quantum-Well Laser Diodes Fabricated by Selective Area Re-Growth on n-GaN Substrates, Journal of Japanese Applied Physics, vol. 40, 2001, pp. L925-L927.
Lidow et al., Gallium Nitride (GaN) Technology Overview, EPC White Paper: WP001, 2012, pp. 1-6.
Lin et al., Influence of Separate Confinement Heterostructure Layer on Carrier Distribution in InGaAsP Laser Diodes with Nonidentical Multiple Quantum Wells, Japanese Journal of Applied Physics, vol. 43, No. 10, 2004, pp. 7032-7035.
Masui et al., Electrical Characteristics of Nonpolar InGaN-Based Light-Emitting Diodes Evaluated at Low Temperature, Japanese Journal of Applied Physics, vol. 46, No. 11, 2007, pp. 7309-7310.
Michiue et al., Recent Development of Nitride LEDs and LDs, Proceedings of SPIE, vol. 7216, 2009, pp. 72161Z-1-72161Z-6.
Nakamura et al., Candela-class high-brightness InGaN/AlGaN double-heterostructure blue-light-emitting diodes, Appl. Phys. Lett., vol. 64, No. 13, 1994, pp. 1687-1689.
Nakamura et al., InGaN/GaN/AlGaN-based laser diodes with modulation-doped strained-layer superlattices grown on an epitaxially laterally overgrown GaN substrate, Applied Physics Letters, vol. 72, No. 2, 1998, pp. 211-213.
Nakamura et al., P-GaN/n-InGaN/n-GaN doubleheterostructure blue-light-emitting diodes, Jpn. J. Appl. Phys., vol. 32, 1993, pp. L8-L11.
Nam et al., Lateral Epitaxial Overgrowth of GaN Films on SiO2 Areas via Metalorganic Vapor Phase Epitaxy, Journal of Electronic Materials, vol. 27, No. 4, Apr. 1998, pp. 233-237.
Okamoto et al., Continuous-Wave Operation of m-Plane InGaN Multiple Quantum Well Laser Diodes, The Japan Society of Applied Physics JJAP Express Letter, vol. 46, No. 9, 2007, pp. L187-L189.
Okamoto et al., High-Efficiency Continuous-Wave Operation of Blue-Green Laser Diodes Based on Nonpolar m-Plane Gallium Nitride, The Japan Society of Applied Physics, Applied Physics Express, vol. 1, Jun. 20, 2008, pp. 072201-1-072201-3.
Okamoto et al., Pure Blue Laser Diodes Based on Nonpolar m-Plane Gallium Nitride with InGaN Waveguiding Layers, Journal of Japanese Applied Physics, vol. 46, No. 35, 2007, pp. L820-L822.
Okubo, Nichia Develops Blue-green Semiconductor Laser w/ 488nm Wavelength, Tech-on, Retrieved from the internet: http://techon.nikkeibp.cojp/english/NEWS_EN/20080122/146009/?ST=english_PRINT, 2008, pp. 1-2.
Park, Crystal Orientation Effects on Electronic Properties of Wurtzite InGaN/GaN Quantum Wells, Journal of Applied Physics, vol. 91, No. 12, Jun. 15, 2002, pp. 9904-9908.
International Application No. PCT/US2009/046786, International Search Report and Written Opinion dated May 13, 2010, 8 pages.
International Application No. PCT/US2009/047107, International Search Report and Written Opinion dated Sep. 29, 2009, 10 pages.
International Application No. PCT/US2009/052611, International Search Report and Written Opinion dated Sep. 29, 2009, 11 pages.
International Application No. PCT/US2010/030939, International Search Report and Written Opinion dated Jun. 16, 2010, 9 pages.
International Application No. PCT/US2010/049172, International Search Report and Written Opinion dated Nov. 17, 2010, 7 pages.
International Application No. PCT/US2011/037792, International Search Report and Written Opinion dated Sep. 8, 2011, 9 pages.
International Application No. PCT/US2015/014567, International Preliminary Report on Patentability dated Aug. 25, 2016, 14 pages.
International Application No. PCT/US2015/014567, International Search Report and Written Opinion dated Jul. 8, 2015, 19 pages.
International Application No. PCT/US2015/014567, Invitation to Pay Add'l Fees and Partial Search Report dated May 1, 2015, 2 pages.
Purvis, Changing the crystal face of gallium nitride, The Advance Semiconductor Magazine, III-Vs Review, vol. 18, No. 8, Nov. 8, 2005, 3 pages.
Romanov et al., Strain-Induced Polarization in Wurtzite III-Nitride Semipolar Layers, J. Appl. Phys., vol. 100, Jul. 25, 2006, pp. 023522-1-023522-10.

(56) References Cited

OTHER PUBLICATIONS

Sato et al., High Power and High Efficiency Green Light Emitting Diode on free-Standing Semipolar (1122) Bulk GaN Substrate, Physica Status Sol. (RRL), vol. 1, Jun. 15, 2007, pp. 162-164.

Sato et al., Optical Properties of Yellow Light-Emitting-Diodes Grown on Semipolar (1122) Bulk GaN Substrate, Applied Physics Letter, vol. 92, No. 22, 2008, pp. 221110-1-221110-3.

Schmidt et al., Demonstration of Nonpolar m-Plane InGaN/GaN Laser Diodes, Japanese Journal of Applied Physics, vol. 46, No. 9, 2007, pp. L190-L191.

Schmidt et al., High Power and High External Efficiency m-plane InGaN Light Emitting Diodes, Japanese Journal of Applied Physics, vol. 46, No. 7, Feb. 9, 2007, pp. L126-L128.

Schoedl et al., Facet Degradation of GaN Heterostructure Laser Diodes, Journal of Applied Physics, vol. 97, No. 12, 2005, pp. 123102-1-123102-8.

Shchekin et al., High Performance Thin-film Flip-Chip InGaN—GaN Light-emitting Diodes, Applied Physics Letters, vol. 89, Aug. 16, 2006, pp. 071109-1-071109-3.

Shen et al., Auger Recombination in InGaN Measured by Photoluminescence, Applied Physics Letters, vol. 91, Oct. 1, 2007, pp. 141101-1-141101-3.

Sink, Cleaved-Facet Group-III Nitride Lasers, University of California, Santa Barbara, Ph.D. Dissertation, Dec. 2000, 251 pages.

Sizov et al., 500-nm Optical Gain Anisotropy of Semipolar (1122) InGaN Quantum Wells, Applied Physics Express, vol. 2, Jun. 19, 2009, pp. 071001-1-071001-3.

Tamboli, Photoelectrochemical etching of gallium nitride for high quality optical devices, Retrieved from the internet: http://adsabs.harvard.edu/abs/2009PhDT . . . 68T., 2009, 207 pages.

Tomiya et al., Dislocation related issues in the degradation of GaN-based laser diodes, IEEE Journal of Selected Topics in Quantum Electronics, vol. 10, No. 6, Nov.-Dec. 2004, pp. 1277-1286.

Tyagi et al., High Brightness Violet InGan/Gan Light EMitting Diodes on Semipolar (1011) Bulk Gan Substrates, Japanese Journal of Applied Physics, vol. 46, No. 7, Feb. 9, 2007, pp. L129-L131.

Tyagi et al., Semipolar (1011) InGaN/GaN Laser Diodes on Bulk GaN Substrates, Japanese Journal of Applied Physics, vol. 46, No. 19, 2007, pp. L444-L445.

Uchida et al., Recent progress in high-power blue-violet lasers, IEEE Journal of Selected Topics in Quantum Electronics, vol. 9, No. 5, Sep.-Oct. 2003, pp. 1252-1259.

Waltereit et al., Nitride semiconductors free of electrostatic fields for efficient white light-emitting diodes, Nature, vol. 406, Aug. 24, 2000, pp. 865-868.

Wierer et al., High-power AlGaInN flip-chip light-emitting diodes, Applied Physics Letters, vol. 78, No. 22, 2001, pp. 3379-3381.

Wikipedia, Gallium nitride, Gallium nitride, retrieved from http://en.wikipedia.org/wiki/Gallium_nitride, Dec. 31, 2014, 6 pages.

Wikipedia, Light-emitting diode, Retrieved from the internet: http://en.wikipedia.org/wiki/Light-emitting diode, Dec. 31, 2014, 44 pages.

Yamaguchi, Anisotropic optical matrix elements in strained GaN-quantum wells with various substrate orientations, Physica Status Solidi (PSS), vol. 5, No. 6, May 2008, pp. 2329-2332.

Yang, Micromachining of Gan Using Photoelectrochemical Etching, Graduate Program in Electronic Engineering, Notre Dame, Indiana, 2005, 168 pages.

Yoshizumi et al., Continuous-Wave Operation of 520 nm Green InGaN-Based Laser Diodes on Semi-Polar {2021} GaN Substrates, Applied Physics Express, vol. 2, No. 9, Aug. 2009, pp. 1-3.

Yu et al., Multiple Wavelength Emission from Semipolar InGaN/GaN Quantum Wells Selectively Grown by MOCVD, Conference on Lasers and Electro-Optics/Quantum Electronics and Laser Science Conference and Photonic Applications Systems Technologies, OSA Technical Digest (CD), 2007, 2 pages.

Zhong et al., Demonstration of High Power Blue-Green Light Emitting Diode on Semipolar (1122) bulk GaN substrate, Electronics Letters, vol. 43, No. 15, Jul. 2007, pp. 825-826.

Zhong et al., High power and high efficiency blue light emitting diode on freestanding semipolar (1011) bulk GaN substrate, Applied Physics Letter, vol. 90, No. 23, 2007, pp. 233504-1-233504-3.

\* cited by examiner

Figure 2: alignment marks

Figure 3: bond pads for alignment

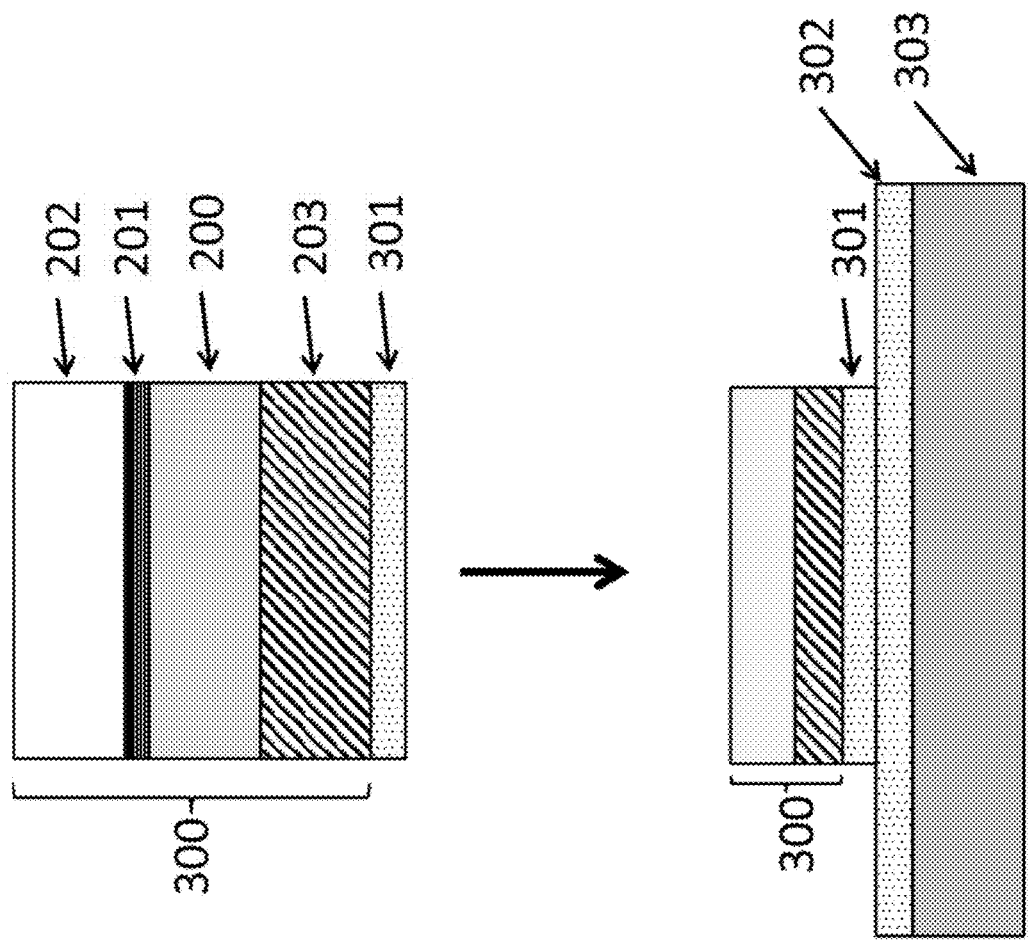
Figure 8A: p-side ridge

SEMICONDUCTOR LASER DIODE ON TILED GALLIUM CONTAINING MATERIAL

CROSS-REFERENCES TO RELATED APPLICATION

The present application is a continuation of U.S. application Ser. No. 16/032,997, filed Jul. 11, 2018, which is a continuation of U.S. application Ser. No. 15/682,148, filed Aug. 21, 2017, which is a continuation of U.S. application Ser. No. 15/218,690, filed Jul. 25, 2016 which is a continuation of U.S. application Ser. No. 14/931,743, filed Nov. 3, 2015, which is a divisional of U.S. application Ser. No. 14/175,622, filed Feb. 7, 2014, now U.S. Pat. No. 9,209,596 issued Dec. 8, 2015, the entire contents of each of which are incorporated herein by reference in their entirety for all purposes.

BACKGROUND

In 1960, the laser was first demonstrated by Theodore H. Maiman at Hughes Research Laboratories in Malibu. This laser utilized a solid-state flash lamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high-end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature which limits their application. Currently the only viable direct blue and green laser diode structures are fabricated from the wurtzite AlGaInN material system. The manufacturing of light emitting diodes from GaN related materials is dominated by the heteroepitaxial growth of GaN on foreign substrates such as Si, SiC and sapphire. Laser diode devices operate at such high current densities that The crystalline defects associated with heteroepitaxial growth are not acceptable in laser diode devices due to the high operational current densities found in laser diodes. Because of this, very low defect-density, free-standing GaN substrates have become the substrate of choice for GaN laser diode manufacturing.

From the above, techniques for improving laser diodes are highly desirable.

SUMMARY

The invention is directed the method of fabrication of optoelectronic devices from semiconductor wafers. In particular, the invention provides a method and device for emitting electromagnetic radiation using nonpolar or semipolar gallium containing substrates such as GaN, AlN, InN, InGaN, AlGaN, and AlInGaN, and others. The invention provides a method and device using a gallium and nitrogen containing substrate of the wurtzite crystal structure configured on any of the (0001), {11-20}, {10-10}, {10-11}, {20-21} and {30-31} families of crystal planes or an offcut of any of these planes according to one or more embodiments, but there can be other configurations. For example, it is possible under certain circumstances to produce gallium and nitrogen containing substrates with zinc blende crystal structures which would be applicable under this invention. Still more particularly, this invention provides a method for processing small semiconductor wafers or non-standard size such that all multiple wafers can be processed in parallel at the majority of steps in the fabrication process. As used herein the term "small" generally means smaller than a handle substrate, although there can be other meanings used by one of ordinary skill in the art. The invention can be applied to optical devices such as lasers and light emitting diodes, among other devices.

This invention provides for the bonding of multiple small-area semiconductor wafers to a "carrier" or "handle" wafer such that the crystallographic directions of the semiconductor wafers are nominally aligned. In other examples, as defined herein a small area substrate is defined as a semiconductor wafer that is less than 2000 mm$^2$ in area and which may have a rectangular or square shape that is not typically encountered in semiconductor technology. In a preferred embodiment the small area substrates are aligned such that the crystallographic directions of the small area substrates deviate from one another by 1 degree or less. In a second embodiment the small area substrates are aligned such that the crystallographic directions of the small area substrates deviate from one another by 5 degrees or less. Bonding is achieved either using an organic adhesive or wax, photo-resist, spin-on-glass or other materials sinterable at low temperatures, metal-metal thermo-compressive bonding, oxide-oxide bonding or bonding with a solder. The invention provides for the small area substrates to be aligned relative to each other with known position or spacing. In a preferred embodiment this is achieved by patterning the handle wafer with alignment marks or with discontinuous bond pads that determine the spacing between small area substrates.

This example provides for the processing of the unbonded side of the small area substrates. Processing steps include metal depositions, annealing, dry and wet etches, deposition of passivation layers such as oxides and nitrides, deposition of planarizing polymers or spin-on-glass and others. Moreover, this example provides for the bonding of the small area substrates as an ensemble to a second handle wafer and the subsequent removal of the first handle wafer such that the crystallographic alignment and in-plane spacing of the small wafers remains unchanged. Backside processing can be performed, such as wafer thinning via lapping, grinding or chemical etching, metal and dielectric deposition, laser scribing and mechanical scribing among others. This example provides for a third bonding of the small area substrates as an ensemble to a third handle wafer and the subsequent removal of the second handle wafer. In the preferred embodiment, the final handle should be a single crystal wafer capable of being cleaved along crystallographic planes. In this preferred embodiment the individual rows of lasers are singulated into composite bars that are composed of a narrow section of the handle wafer bonded to narrow sections of one or more of the small area substrates which are themselves composed of a linear array of laser die. In a preferred embodiment these composite bars are used to carry out final process steps on laser bars including deposition of reflective coatings on back facets and deposition of reflective or anti-reflective coatings on front facets.

Additional benefits are achieved over pre-existing techniques using the invention. In particular, the invention enables a cost-effective optical device for laser applications. In a specific embodiment, the present optical device can be manufactured in a relatively simple and cost effective manner. Depending upon the embodiment, the present apparatus and method can be manufactured using conventional materials and/or methods according to one of ordinary skill in the art. The present laser device uses a non-polar or semipolar gallium nitride material capable of achieve a blue or green laser device, among others. In one or more embodiments, the laser device is capable of emitting long wavelengths such as those ranging from about 480 nm to greater than about 540 nm, but can be others such as 540 nm to 660 nm and 420 to 480 nm. Depending upon the embodiment, one or more of these benefits may be achieved. Of course, there can be other variations, modifications, and alternatives.

A further understanding of the nature and advantages of the invention may be realized by reference to the latter portions of the specification and attached drawings.

BRIEF DESCRIPTION OF THE DRAWINGS

FIG. 8A illustrates laser diode device wafer including GaN substrate layer, n-type cladding, light emitting layers and p-type cladding in an example of the present invention.

DETAILED DESCRIPTION

Figure 1:
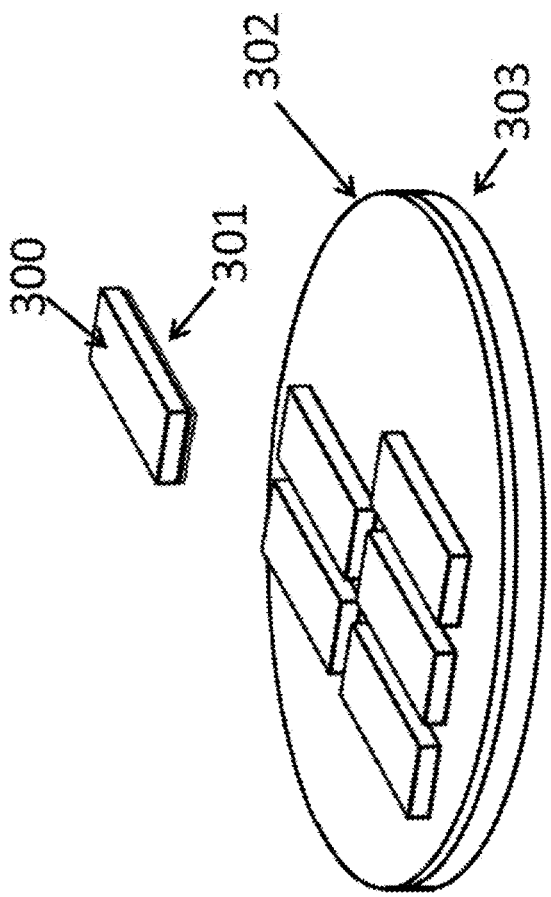
FIG. 1 is a simplified illustration of a handle wafer with several small area substrates according to an example of the present invention.

The invention provides a method for fabricating an optical device, e.g., laser, LED. Typically these devices are fabricated on one substrate at a time. What follows is a general description of the typical configuration and fabrication of these devices.

However, as further background, gallium nitride, and related crystals are difficult to produce in bulk form. Growth technologies capable of producing large area boules of GaN are still in the infancy. While large area, free-standing GaN substrates (e.g. with diameters of two inches or greater) are available commercially, the availability of large area non-polar and semi-polar GaN substrates is quite restricted. Typically, these orientations are produced by the growth of a c-plane oriented bool, which is then sliced into rectangular wafers at some steep angle relative to the c-plane. The width of these wafers is limited by the thickness of the c-plane oriented bool, which in turn is restricted by the method of boule production (e.g. typically hydride vapor phase epitaxy (HVPE) on a foreign substrate). Such small wafer sizes are limiting in two respects. The first is that epitaxial growth must be carried out on such a small wafer, which increases the area fraction of the wafer that is unusable due to non-uniformity in growth near the wafer edge. The second is that after epitaxial growth of optoelectronic device layers on a substrate, the same number of processing steps are required on the small wafers to fabricate the final device as one would use on a large area wafer. Both of these effects drive up the cost of manufacturing devices on such small wafers, as both the cost per device fabricated and the fraction of wafer area that is unusable increases with decreasing wafer size.

Processing of multiple wafers in parallel could help reduce these costs, however it requires that the wafers be connected together into a single unit. This can be achieved by bonding the wafers to another object that can be used as a "carrier" or "handle" in order to form a composite structure. Semiconductor lasers exhibit a challenge in that devices are commonly singulated from a semiconductor wafer by the cleaving of the semiconductor crystal along crystallographic planes. Cleaving has the advantage over sawing or through wafer cutting with a laser in that there is no kerf, i.e. width of material lost due to the thickness of the blade or spot size of a cutting laser. Cleaving also is used in producing highly smooth and flat surfaces at either end of a laser bar to act as reflective surfaces. Dicing with a saw or laser would leave rough surfaces that would absorb or scatter light and result in poor performance as a laser. Moreover, in substrate orientations with low in-plane symmetry (e.g. non-polar and semi-polar orientations of GaN) there is typically a preferential orientation for the laser ridge with respect to the crystal structure of the device. Cleavage of the substrate is a catastrophic event, and cannot be localized to only part of a wafer; i.e. the crack formed during the cleaving will tend to propagate across the entire wafer. Cleaves, for either singulation or facet formation, must be aligned with the laser diode ridges and other patterning to avoid cleaving a device in half.

Typically, laser diode wafers fabricated with cleaved facets are cleaved twice. They are initially singulated into so-called laser bars which consist of many individual laser die side by side with the laser ridges running perpendicular to the cleaved facets such that the cleaves that form the bar also form the front and back facet of the laser cavities. The bars are then stacked one atop the other with cleaved facets facing out. Reflective and anti-reflective coatings as required by the laser diode design are then deposited onto the front and back facets as a group. In the case of several small area substrates bonded haphazardly to a handle and processed in parallel with lithography aligned to each individual substrate, then one would need to debond and cleave each substrate separately. This example is the method of bonding the ensemble of small area substrates to a handle wafer while having the crystallographic directions of the individual substrates aligned as wells as having the substrates placed on the handle wafer in such a way that optimizes utilization of the substrate surface while preserving the translational symmetry of the mask pattern between substrates. This allows all processing steps to be carried out on the ensemble of substrates in parallel; including cleaving into bars and bar-level processing through to die singulation. Further details of the present techniques can be found throughout the present specification, and more particularly below.

FIG. 1: Illustration of a handle wafer 303 with several small area substrates 300 bonded to it. Layers of bonding media 301 and 302 are overlaid on the bonding surfaces of the wafers and handle.

Figure 2:
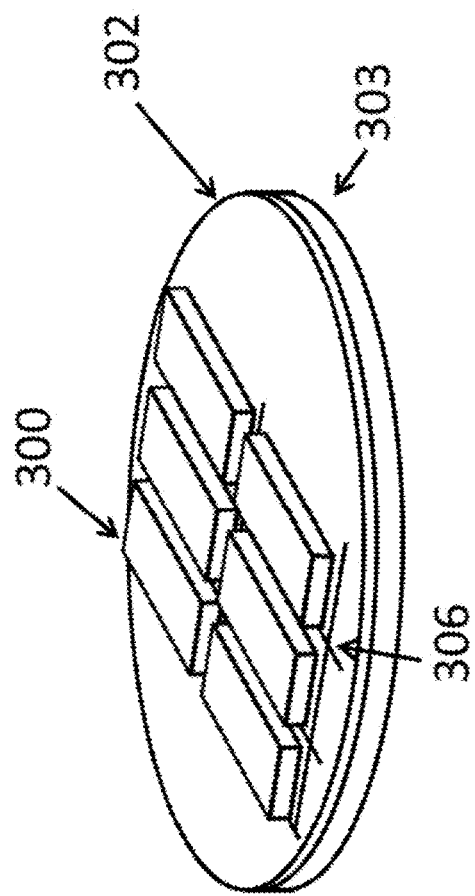
FIG. 2 is a simplified illustration of a handle wafer bonded to small area substrates using a bonding media in an example according to the present invention.

FIG. 2: Illustration of a handle wafer 303 bonded to small area substrates 300 using a bonding media 302. Alignment marks 306 are patterned into the bonding media overlaid on the handle wafer.

Figure 3:
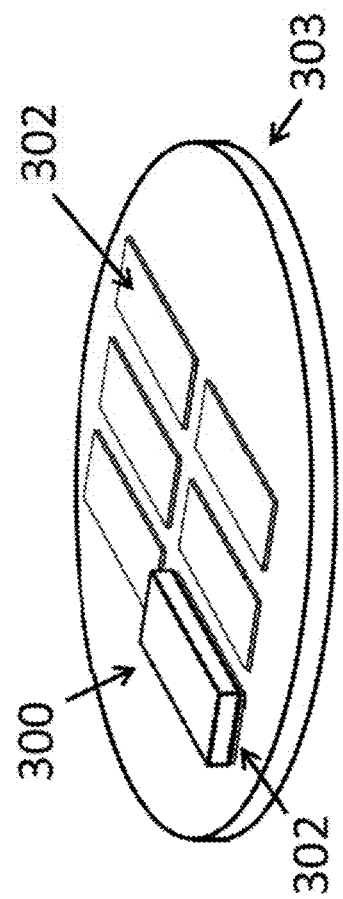
FIG. 3 is a simplified illustration of a handle wafer bonded to small area substrates using a bonding media that has been deposited onto the handle wafer in a pattern in an example according to the present invention.

FIG. 3: Illustration of a handle wafer 303 bonded to small area substrates 300 using a bonding media 302 that has been deposited onto the handle wafer in a pattern. The pattern allows for quick alignment of the small area wafers to the handle.

Figure 4:
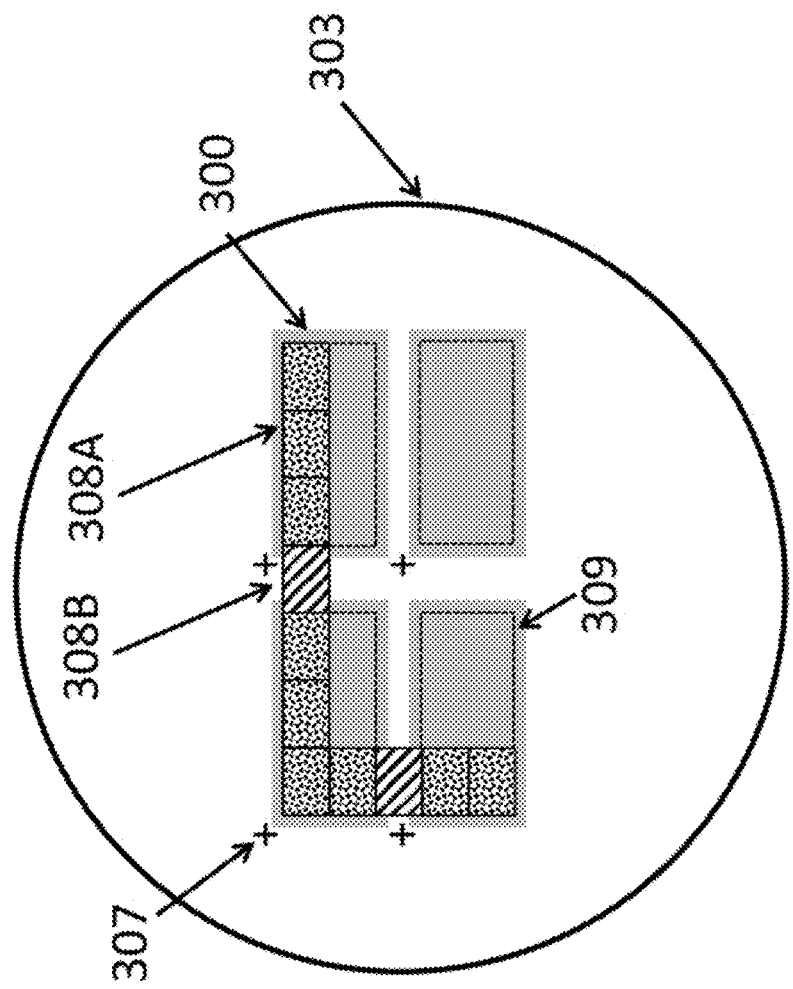
FIG. 4 is a simplified illustration of a handle wafer bonded to several small area substrates according to an example of the present invention.

FIG. 4: Illustration of a handle wafer 303 bonded to several small area substrates 300. Alignment marks 307 were positioned on the handle wafer to allow for precise placement of small area substrates. Each small area wafer has an edge exclusion region with a border 309. The reticle exposure area 308A is chosen such that a whole number of exposures fully cover the central good region of the small area wafers. The spacing between small area wafers is chosen such that a whole number of exposures 308B span the distance between the edges of the exclusion region of adjacent small area substrates.

Figure 5:
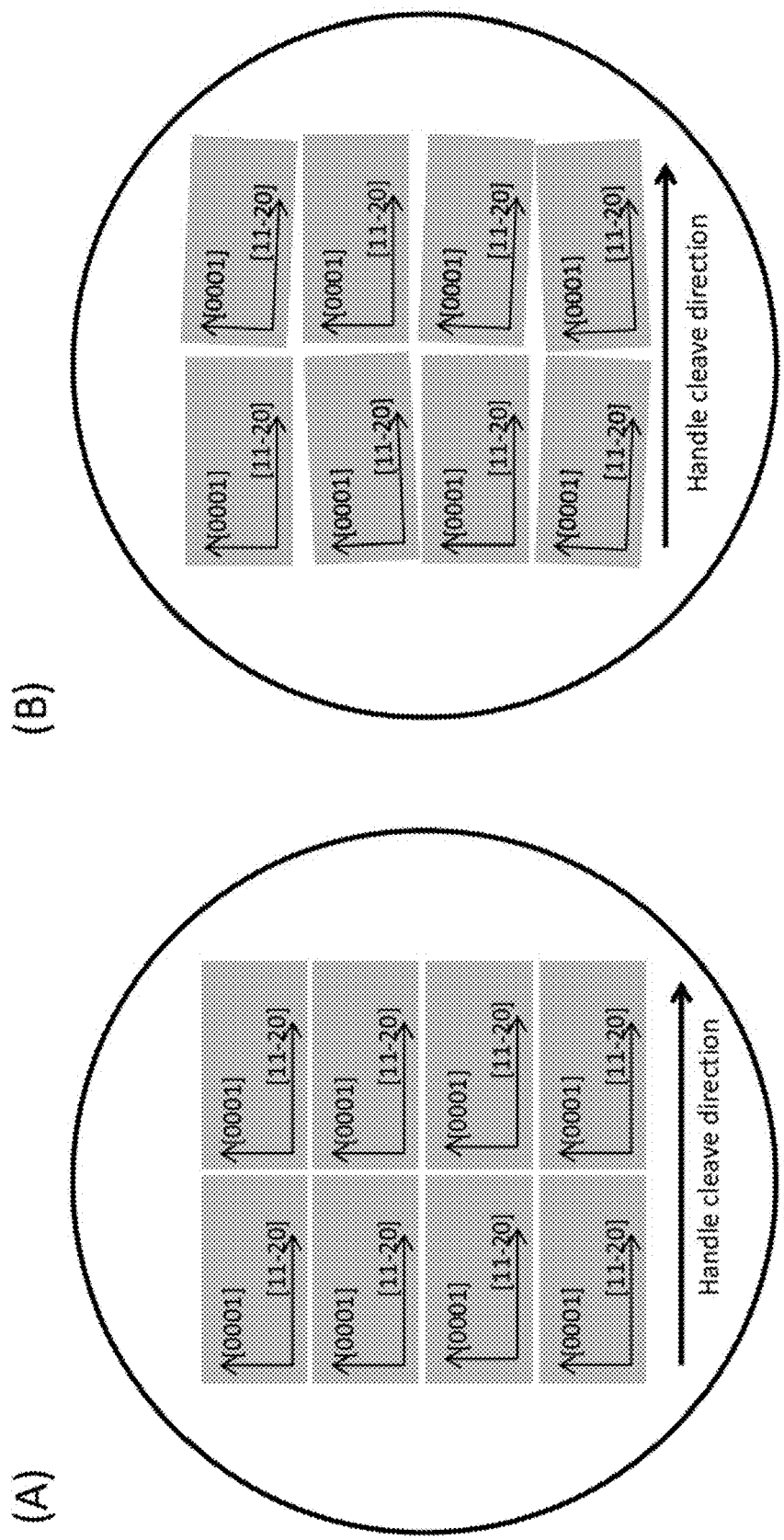
FIG. 5 is a simplified illustration of azimuthal (i.e. in-plane angular) alignment of many small area wafers according to an example of the present invention.

FIG. 5: Illustration of azimuthal (i.e. in-plane angular) alignment of many small area wafers. (A) shows wafers with a high degree of azimuthal alignment. (B) shows wafers bonded with a low degree of azimuthal alignment. In the case of (B) in order for laser ridges to be aligned parallel to the [0001] in-plane projection the mask would have to be aligned to each wafer individually. The wafers in (B) would also not be cleavable as an ensemble since any cleave initiated in the handle would result in cleaves on the wrong facets in the substrates. These wafers would have to be debonded and cleaved individually.

Figure 6:
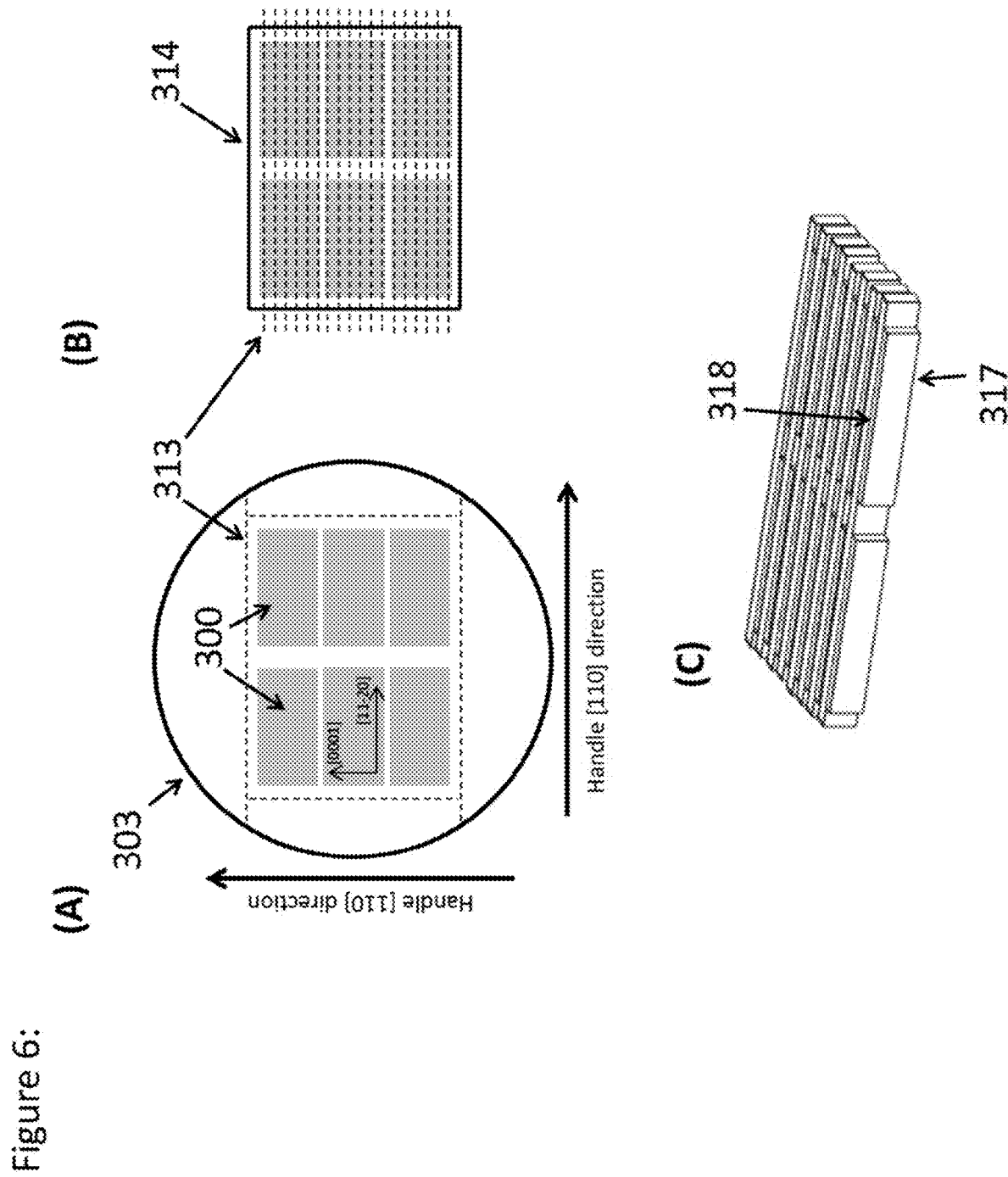
FIG. 6 is a simplified illustration of cleaving of bonded wafers as an ensemble in an example of the present invention.

FIG. 6: Illustration of cleaving of bonded wafers as an ensemble. The handle 303 is cleaved or sawed into a regular shape which will yield composite bars 314 of uniform length. The handle and small area wafers are then cleaved perpendicular to the laser ridges. Cleaving may include formation of guide or skip scribes on either or both the front or back of the handle or small area substrates. The bars are then stacked in preparation for deposition of reflective or antireflective coatings on the front and back facets 317 & 318.

Figure 7:
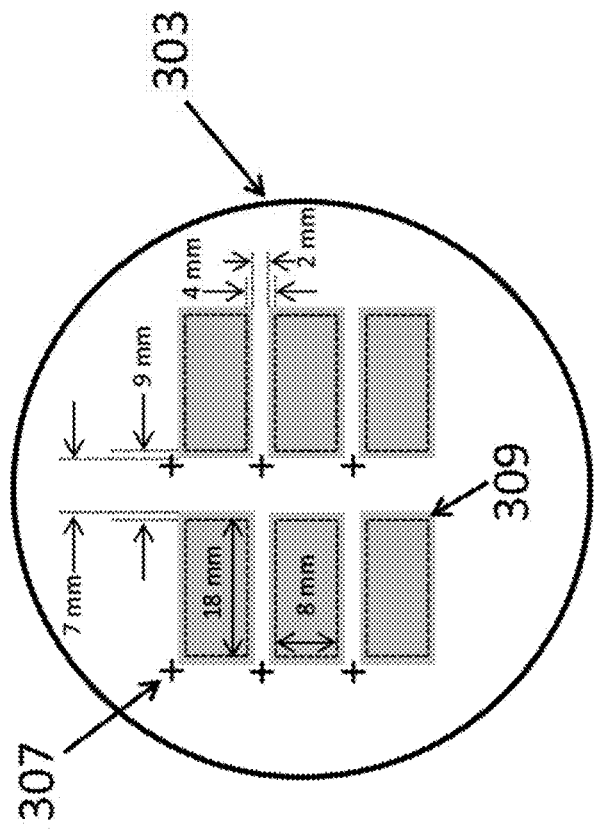
FIG. 7 is a simplified illustration of bonding from examples structures.

FIG. 7: Illustration of bonding from examples structures. 10 mm×20 mm laser diode device wafers are bonded to a handle wafer 303. Alignment marks 307 allow for precise placement of device wafers. The interface between the central good area and the edge exclusion region is shown by the dashed lines 309. The good area existing inside of the edge exclusion region has a size of 8 mm×18 mm.

FIG. 8A: Laser diode device wafer 300 including GaN substrate layer 203, n-type cladding 200, light emitting layers 201 and p-type cladding 202. A gold bonding layer is deposited on the backside of the substrate layer. The device wafer is then bonded to the first handle 303 via a gold bonding layer 302.

Figure 8B:
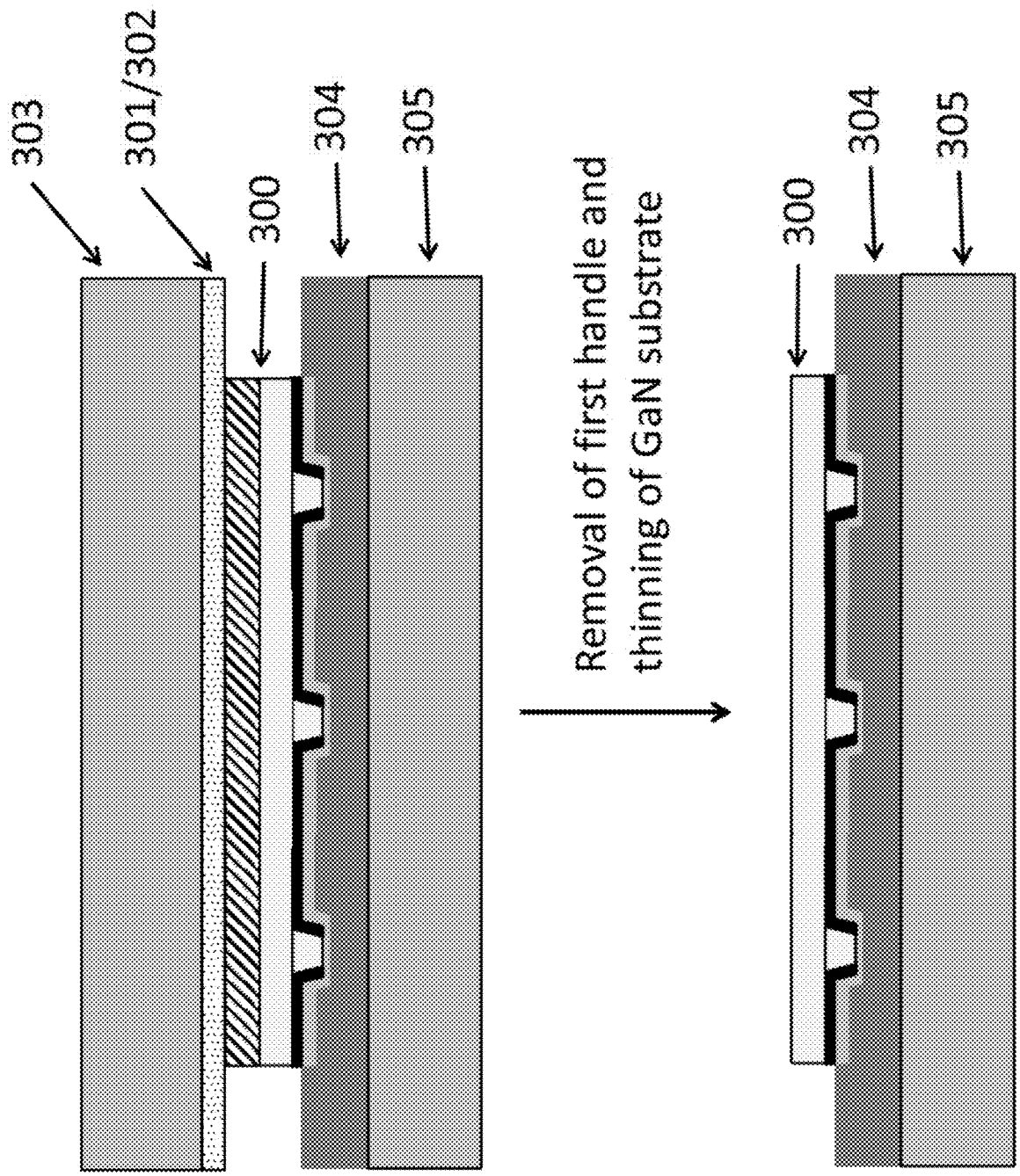
FIG. 8B illustrates ridges, passivation layers and electrical contacts have been fabricated into the epitaxial layers of the laser device wafer in an example of the present invention.

FIG. 8B: Ridges, passivation layers and electrical contacts have been fabricated into the epitaxial layers of the laser device wafer 300. The top of the epitaxial layers are then bonded to the second handle 305 using the second bonding medium 304, which in this case is an adhesive wax. The first handle is removed and the GaN substrate is thinned.

Figure 8C:
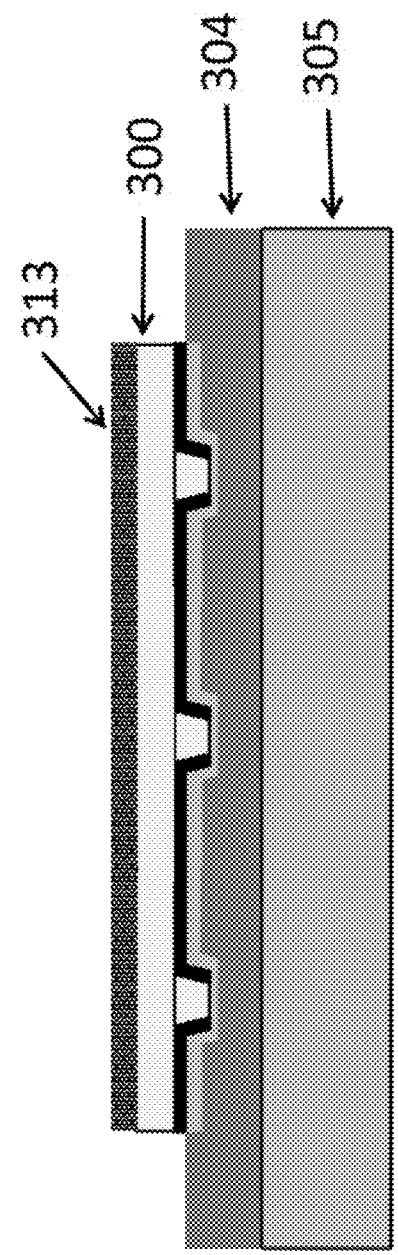
FIG. 8C: Laser device wafer, bonded to second handle. Backside electrical contact layers 313 overlaid on backside of thinned substrate layer. The device wafer is subsequently debonded from the second handle and cleaved into bars.

FIG. 8C: Laser device wafer, bonded to second handle. Backside electrical contact layers 313 overlaid on backside of thinned substrate layer. The device wafer is subsequently debonded from the second handle and cleaved into bars.

Figure 9:
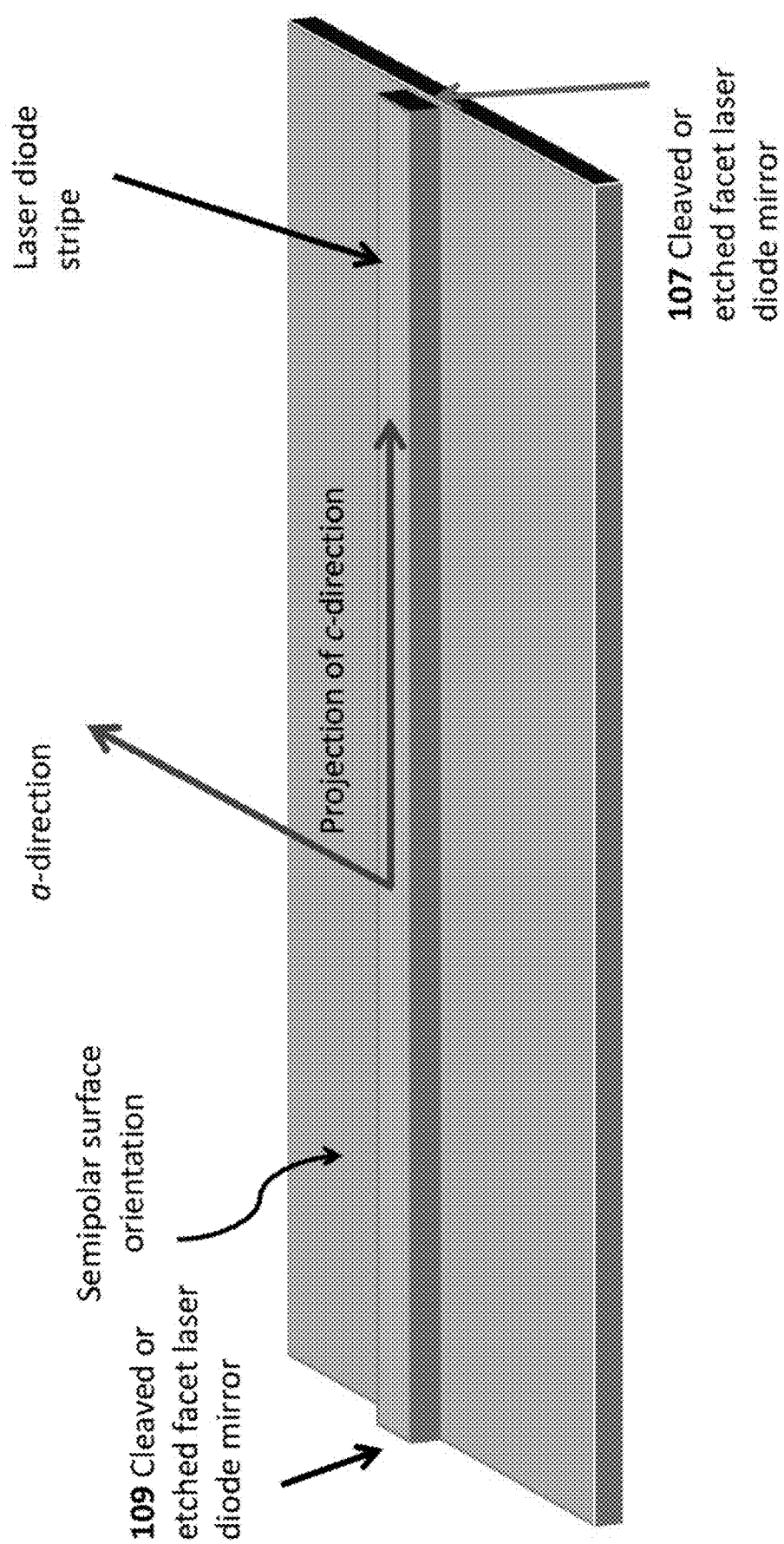
FIG. 9: Schematic diagram of semipolar laser diode with the cavity aligned in the projection of c-direction with cleaved or etched mirrors according to an example of the present invention.

FIG. 9: Schematic diagram of semipolar laser diode with the cavity aligned in the projection of c-direction with cleaved or etched mirrors according to an example of the present invention.

Figure 10:
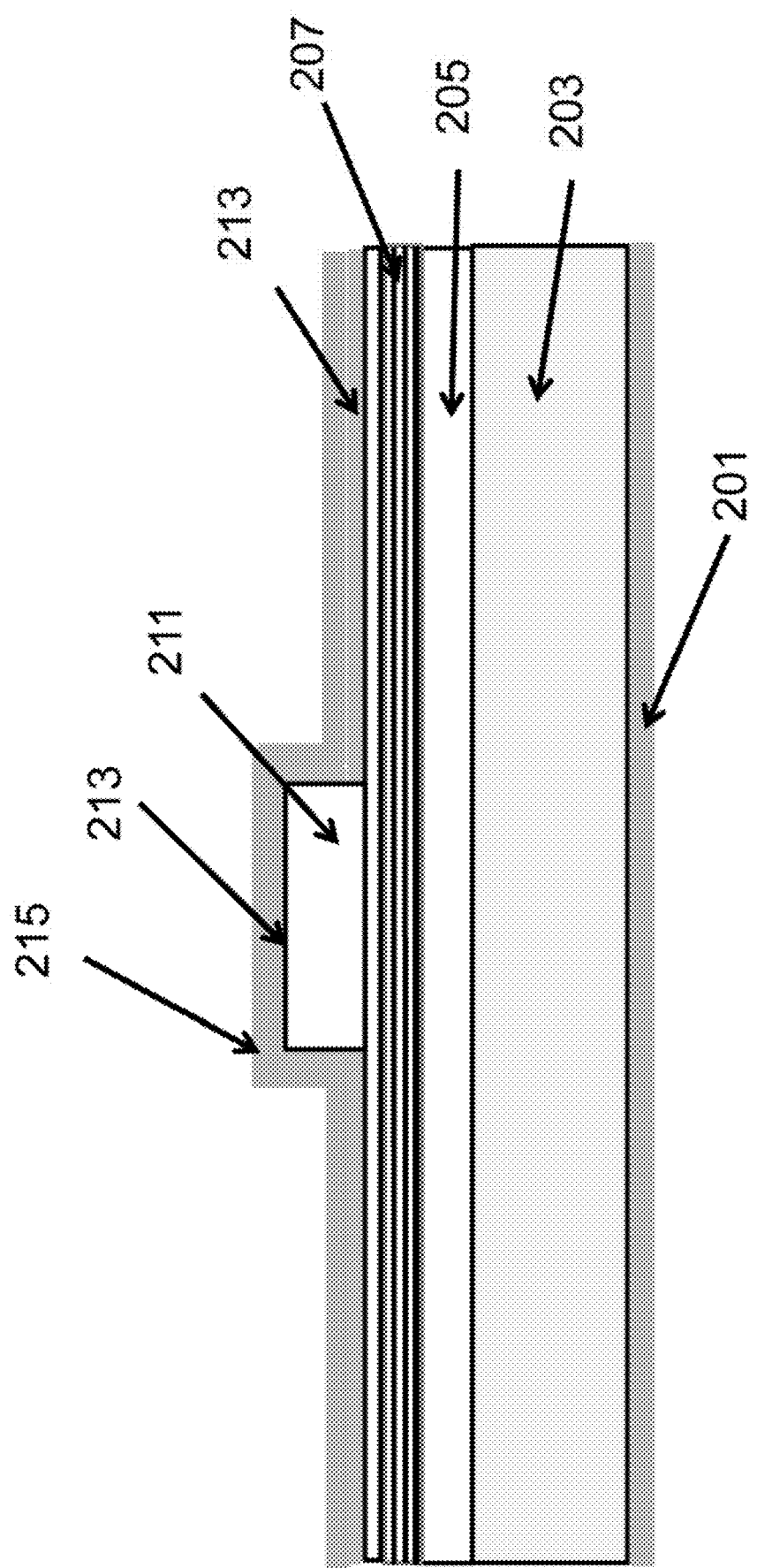
FIG. 10: Schematic cross-section of ridge laser diode according to an example of the present invention.

FIG. 10: Schematic cross-section of ridge laser diode according to an example of the present invention.

These aforementioned devices include a gallium and nitrogen containing substrate (e.g., GaN) comprising a surface region oriented in either a semipolar or non-polar configuration, but can be others. The device also has a gallium and nitrogen containing material comprising InGaN overlying the surface region. In a specific embodiment, the present laser device can be employed in either a semipolar or non-polar gallium containing substrate, as described below. As used herein, the term "substrate" can mean the bulk substrate or can include overlying growth structures such as a gallium and nitrogen containing epitaxial region, or functional regions such as n-type GaN, combinations, and the like. We have also explored epitaxial growth and cleave properties on semipolar crystal planes oriented between the nonpolar m-plane and the polar c-plane. In particular, we have grown on the {30-31} and {20-21} families of crystal planes. We have achieved promising epitaxy structures and cleaves that will create a path to efficient laser diodes operating at wavelengths from about 400 nm to green, e.g., 500 nm to 540 nm. These results include bright blue epitaxy in the 450 nm range, bright green epitaxy in the 520 nm range, and smooth cleave planes orthogonal to the projection of the c-direction. It is desirable to align the laser cavities parallel to the projection of the c-direction for maximum gain on this family of crystal planes.

In a specific embodiment, the gallium nitride substrate member is a bulk GaN substrate characterized by having a semipolar or non-polar crystalline surface region, but can be others. In a specific embodiment, the bulk nitride GaN substrate comprises nitrogen and has a surface dislocation density between about $10E5$ $cm^{-2}$ and about $10E7$ $cm^{-2}$ or below $10E5$ $cm^{-2}$. The nitride crystal or wafer may comprise $Al_xIn_yGa_{1-x-y}N$, where $0 \le x$, y, $x+y \le 1$. In one specific embodiment, the nitride crystal comprises GaN. In one or more embodiments, the GaN substrate has threading dislocations, at a concentration between about $10E5$ $cm^{-2}$ and about $10E8$ $cm^{-2}$, in a direction that is substantially orthogonal or oblique with respect to the surface. As a consequence of the orthogonal or oblique orientation of the dislocations, the surface dislocation density is between about $10E5$ $cm^{-2}$ and about $10E7$ $cm^{-2}$ or below about $10E5$ $cm^{-2}$. In a specific embodiment, the device can be fabricated on a slightly off-cut semipolar substrate as described in U.S. Ser. No. 12/749,466 filed Mar. 29, 2010, which claims priority to U.S. Provisional No. 61/164,409 filed Mar. 28, 2009, commonly assigned, and hereby incorporated by reference herein.

The substrate typically is provided with one or more of the following epitaxially grown elements, but is not limiting:
 an n-GaN cladding region with a thickness of 50 nm to about 6000 nm with a Si or oxygen doping level of about $5E16$ $cm^{-3}$ to $1E19$ $cm^{-3}$
 an InGaN region of a high indium content and/or thick InGaN layer(s) or Super SCH region;
 a higher bandgap strain control region overlying the InGaN region;
 optionally, an SCH region overlying the InGaN region;
 multiple quantum well active region layers comprised of three to five or four to six 3.0-5.5.0 nm InGaN quantum wells separated by 1.5-10.0 nm GaN barriers
 optionally, a p-side SCH layer comprised of InGaN with molar a fraction of indium of between 1% and 10% and a thickness from 15 nm to 100 nm
 an electron blocking layer comprised of AlGaN with molar fraction of aluminum of between 5% and 20% and thickness from 10 nm to 15 nm and doped with Mg.
 a p-GaN cladding layer with a thickness from 400 nm to 1000 nm with Mg doping level of $5E17$ $cm^{-3}$ to $1E19$ $cm^{-3}$
 a p++-GaN contact layer with a thickness from 20 nm to 40 nm with Mg doping level of $1E20$ $cm^{-3}$ to $1E21$ $cm^{-3}$ Typically each of these regions is formed using at least an epitaxial deposition technique of metal organic chemical vapor deposition (MOCVD), molecular beam epitaxy (MBE), or other epitaxial growth techniques suitable for GaN growth. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 2-10 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \le w$, x, y, z, $w+x$, $y+z \le 1$, where $w<u$, y and/or $x>v$, z so that the bandgap of the well layer(s) is less than that of the barrier layer(s) and the n-type layer. The well layers and barrier layers may each have a thickness between about 1 nm and about 15 nm. In another embodiment, the active layer comprises a double heterostructure, with an InGaN or AlwInxGa1-w-xN layer about 10 nm to 100 nm thick surrounded by GaN or $Al_yIn_zGa_{1-y-z}N$ layers, where $w<u$, y and/or $x>v$, z. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. In some embodiments, an electron blocking layer is preferably deposited. The electron-blocking layer may comprise $Al_sIn_tGa_{1-s-t}N$, where $0 \le s$, t, $s+t \le 1$, with a higher bandgap than the active layer, and may be doped p-type or the electron blocking layer comprises an AlGaN/GaN superlattice structure, comprising alternating layers of AlGaN and GaN. Alternatively, there may be no electron blocking layer. As noted, the p-type gallium nitride structure, is deposited above the electron blocking layer and active layer(s). The p-type layer may be doped with Mg, to a level between about $10E16$ cm–3 and $10E22$ cm–3, and may have a thickness between about 5 nm and about 1000 nm. The outermost 1-50 nm of the p-type layer may be doped more heavily than the rest of the layer, so as to enable an improved electrical contact.

FIG. 10 is a simplified schematic cross-sectional diagram illustrating a laser diode structure according to embodiments of the present disclosure. This diagram is merely an example, which should not unduly limit the scope of the claims herein. One of ordinary skill in the art would recognize other variations, modifications, and alternatives. As shown, the laser device includes gallium nitride substrate 203, which has an underlying n-type metal back contact region 201. In an embodiment, the metal back contact region is made of a suitable material such as those noted below and others. Further details of the contact region can be found throughout the present specification and more particularly below.

In an embodiment, the device also has an overlying n-type gallium nitride layer 205, an active region 207, and an overlying p-type gallium nitride layer structured as a laser stripe region 211. Additionally, the device also includes an n-side separate confinement hetereostructure (SCH) 206, p-side guiding layer or SCH 208, p-AlGaN EBL 209, among other features. In an embodiment, the device also has a p++ type gallium nitride material 213 to form a contact region. In an embodiment, the p++ type contact region has a suitable thickness and may range from about 10 nm 50 nm, or other thicknesses. In an embodiment, the doping level can be higher than the p-type cladding region and/or bulk region. In an embodiment, the p++ type region has doping concentration ranging from about $10^{19}$ to $10^{21}$ Mg/cm$^3$, and others. The p++ type region preferably causes tunneling between the semiconductor region and overlying metal contact region. In an embodiment, each of these regions is formed using at least an epitaxial deposition technique of metal organic chemical vapor deposition (MOCVD), molecular beam epitaxy (MBE), or other epitaxial growth techniques suitable for GaN growth. In an embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-2}$ and $10^{20}$ cm$^{-3}$.

The device has a laser stripe region formed overlying a portion of the off-cut crystalline orientation surface region. As example, FIG. 9 is a simplified schematic diagram of semipolar laser diode with the cavity aligned in the projection of c-direction with cleaved or etched mirrors. The laser stripe region is characterized by a cavity orientation substantially in a projection of a c-direction, which is substantially normal to an a-direction. The laser strip region has a first end 107 and a second end 109 and is formed on a projection of a c-direction on a {20-21} gallium and nitrogen containing substrate having a pair of cleaved mirror structures, which face each other. The first cleaved facet comprises a reflective coating and the second cleaved facet comprises no coating, an antireflective coating, or exposes gallium and nitrogen containing material. The first cleaved facet is substantially parallel with the second cleaved facet. The first and second cleaved facets are provided by a scribing and breaking process according to an embodiment or alternatively by etching techniques using etching technologies such as reactive ion etching (ME), inductively coupled plasma etching (ICP), or chemical assisted ion beam etching (CAIBE), or other method. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally 15-20 um deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on one or more of the facets. In a specific embodiment, backside laser scribe often requires that the substrates face down on the tape. With front-side laser scribing, the backside of the substrate is in contact with the tape. Of course, there can be other variations, modifications, and alternatives.

Laser scribe Pattern: The pitch of the laser mask is about 200 um, but can be others. The method uses a 170 um scribe with a 30 um dash for the 200 um pitch. In a preferred embodiment, the scribe length is maximized or increased while maintaining the heat affected zone of the laser away from the laser ridge, which is sensitive to heat.

Laser scribe Profile: A saw tooth profile generally produces minimal facet roughness. It is believed that the saw tooth profile shape creates a very high stress concentration in the material, which causes the cleave to propagate much easier and/or more efficiently.

In a specific embodiment, the method of facet formation includes subjecting the substrates to mechanical scribing for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a diamond tipped scribe to physically scribe the laser bars, though as would be obvious to anyone learned in the art a scribe tipped with any material harder than GaN would be adequate. In a specific embodiment, the laser is configured on a system, which allows for accurate scribe lines configured in one or more different patterns and profiles. In one or more embodiments, the mechanical scribing can be performed on the back-side, front-side, or both depending upon the application. Of course, there can be other variations, modifications, and alternatives.

In a specific embodiment, the method uses backside scribing or the like. With backside mechanical scribing, the method preferably forms a continuous line scribe that is perpendicular to the laser bars on the backside of the GaN substrate. In a specific embodiment, the laser scribe is generally 15-20 um deep or other suitable depth. Preferably, backside scribing can be advantageous. That is, the mechanical scribe process does not depend on the pitch of the laser bars or other like pattern. Accordingly, backside scribing can lead to a higher density of laser bars on each substrate according to a preferred embodiment. In a specific embodiment, backside mechanical scribing, however, may lead to residue from the tape on one or more of the facets. In a specific embodiment, backside mechanical scribe often requires that the substrates face down on the tape. With front-side mechanical scribing, the backside of the substrate is in contact with the tape. Of course, there can be other variations, modifications, and alternatives.

Etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide (SiO2), silicon nitride (SixNy), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and 93 degrees or between about 89 and 91 degrees from the surface plane of the wafer. The etched facet surface region must be very smooth with root mean square roughness values of less than 50 nm, 20 nm, 5 nm, or 1 nm. Lastly, the etched must be substantially free from damage, which could act as nonradiative recombination centers and hence reduce the COMD threshold. CAME is known to provide very smooth and low damage sidewalls due to the chemical nature of the etch, while it can provide highly vertical etches due to the ability to tilt the wafer stage to compensate for any inherent angle in etch.

The laser stripe is characterized by a length and width. The length ranges from about 50 microns to about 3000 microns, but is preferably between 10 microns and 400 microns, between about 400 microns and 800 microns, or about 800 microns and 1600 microns, but could be others. The stripe also has a width ranging from about 0.5 microns to about 50 microns, but is preferably between 0.8 microns and 2.5 microns for single lateral mode operation or between 2.5 um and 35 um for multi-lateral mode operation, but can be other dimensions. In a specific embodiment, the present device has a width ranging from about 0.5 microns to about 1.5 microns, a width ranging from about 1.5 microns to about 3.0 microns, a width ranging from 3.0 microns to about 35 microns, and others. In a specific embodiment, the width is substantially constant in dimension, although there may be slight variations. The width and length are often formed using a masking and etching process, which are commonly used in the art.

The laser stripe is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

Conventional semiconductor fabrication based on lithographic processes enjoy an economy of scale in that fabrication costs are typically independent of wafer size. Indeed, per wafer costs in terms of time and processing steps may be higher for smaller wafers as special jigs and fixtures may be need to provide a safe means of processing small wafers on equipment designed for much larger wafers. It would be advantageous to be able to process many small wafers in parallel such that the cost per fabrication step is shared by many wafers, lowering the per device cost of fabrication. One might imagine that one could simply bond many wafers to a handle wafer of the correct dimensions, however this would ignore several aspects of laser diode fabrication that require a special methodology for carrying out the bonding and processing. These problems include:

Alignment of lithography with both the crystal structure of the small substrates such that ridges and facets are properly oriented for highest gain and lowest loss;

Alignment of small substrates with the lithographic pattern such that overlap of laser dies with the edge exclusion region of each small wafer is minimized so as to maximize device yield.

This invention describes a method for overcoming these issues at all steps in the laser diode fabrication process. This method includes the steps of:

Providing aligning features on the handle wafer such that the small gallium and nitrogen containing wafers can be bonded at specified locations on the handle that allow for optimized yield of devices within the area of the small gallium and nitrogen containing wafers that is not part of the edge exclusion zone.

Providing aligning features on the handle wafer such that small gallium and nitrogen wafers can be bonded with a reference crystallographic direction to a reference direction on the handle wafer.

Determining the orientation of a reference crystal direction for each small gallium and nitrogen wafer;

Aligning the small gallium and nitrogen wafers to a reference direction on the first handle wafer such that the reference crystal direction for all small gallium and nitrogen wafers bonded to a single handle wafer are aligned;

Bonding each small gallium and nitrogen wafer to the handle either sequentially or via a two-step process of wafer placement and then bonding of all small gallium and nitrogen wafers simultaneously.

The method may include the subsequent steps of:

Processing of the top-side-side features of the laser devices on the small gallium nitrogen wafers.

Bonding the small gallium and nitrogen wafers and their handle as an ensemble to a second handle wafer using a second bonding medium.

Removal of the first handle and first bonding medium.

Processing of the backside features of the devices on the small gallium and nitrogen wafers.

Bonding the small gallium and nitrogen wafers and their handle as an ensemble to a third handle wafer using a third bonding medium.

Removal of the second handle and second bonding medium.

Cleaving of the first, second or third handle to form so called bars of laser devices, where the cleaving into bars also forms the first and second faceted mirrors of the laser cavities.

Formation of the laser facets using an etching process selected from chemical assisted ion beam etching, inductively coupled plasma etching, or reactive ion etching.

Handle wafers can be composed of GaN, AlN, Al2O3, Si, Ge, SiC, quartz, silicate containing glasses, GaAs, InP, GaP, tungsten, molybdenum, steel, copper, aluminum and gold among others. In a preferred embodiment handle wafers used in process steps where the handle will be cleaved will be single crystal wafers, though polycrystalline, amorphous and composite handle wafers composed of more than one material are useable in this method.

In a preferred embodiment the bonding media will be deposited either on the handle wafer or the bonded surface of the small wafers or both. In a preferred embodiment, functional device layers can be overlaid on the substrate wafer before application of the bonding media. For example, metallic electrical contact layers may be evaporated onto the p-type surface of the laser device wafer. A thick gold bonding layer is then overlaid using evaporation deposition over the electrical contact layers. Such functional layers may include but are not limited to: dielectric passivation, electrical contact layers, lateral optical confinement layers, vertical optical confinement layers, current spreading layers and current aperture layers.

Bonding media and techniques applicable to this invention include metal-metal thermocompressive bonding (e.g. Au—Au bonding), organic waxes and polymers (e.g. crystalbond, polymethylmethacrylate [PMMA], photo-resist, benzocyclobutene, etc.), spin-on-glass and metal solders among others. For example, in one embodiment the handle wafer and the bonded surface of the small wafers are coated in a thin layer (0.05-5 microns) of gold either by evaporation, sputtering or electroplating. Other metals can be included in the metal layers to promote adhesion; for example layers of Ti may be included. The small wafers and the handle are bonded together gold layer to gold layer at temperatures above 150 C and at pressures greater than 15 pounds per square inch. In another embodiment, the handle wafers is coated in an organic wax with low melting point (e.g. Crystalbond 509). The handle can be coated either by melting of solid wax or by spin on of wax dissolved in a solvent. The small area wafers are then aligned to their final position before being bought into contact with the wax. The wax is melted by elevation of the entire handle wafer or local heating around the small wafer and the small wafer. Small amounts of pressure may be used to bring wax into intimate contact with the small wafer.

In a preferred embodiment the first handle will be patterned with features that allow for proper angular and lateral alignment of the small wafers during the initial bonding process. The second and third handle need not be patterned as the small wafers will be transferred as an ensemble while still bonded and held rigidly to a handle wafer. The alignment features may be produced by patterning the bonding media deposited on the handle wafer, etching features into the handle, deposition of a material, e.g. metal, on the handle wafer or the bonding media. If the handle is transparent to visible or non-visible wavelengths of light then the patterning for alignment can be provided on the opposite side of the handle from the bonded small wafers.

Alignment features and proper alignment of small area substrates to each other are critical in two regards. The first is in embodiments where a handle wafer is cleaved and the cleave propagates into one or more small wafers bonded to the handle. In order for the cleave to propagate into the small wafers and form a facet that is not highly scattering, and therefore lossy, the cleavage plain of the handle must be aligned sufficiently close to the orientation of a cleavage plane in the small area substrate. If the two cleavage planes deviate then the handle may dominate the cleave direction, forcing the cleave in the small area wafer to be composed of a vicinal surface which deviates from a cleavage plane and has a microstructure dominated by microfacets or is otherwise neither planar nor smooth. The second advantage is in the case of forming ridges that maximize gain. As mentioned above, it has been found that the gain in non-polar and semi-polar GaN laser diode devices is dependent on the crystallographic orientation of the laser ridge. In a process where multiple small area wafers are lithographically patterned with ridge features using a single alignment, it is necessary that the small area wafers be bonded to the handle wafer with sufficiently close crystallographic alignment among the plurality of small area wafers that the fabricated ridges are patterned to within some small deviation of the optimal crystallographic orientation on all of the small area wafers. In a particular embodiment, where the mirror facets on either end of the laser ridges are formed by an etch process rather than a cleave the tolerance for the alignment of the small area wafers is somewhat larger than for cleaved facets as the dependence of the device gain on orientation is somewhat less than the dependence of cleave quality on orientation. It is therefore advantageous to combine etched facets with crystallographically aligned small area wafers in any processing of an ensemble of small area wafers bonded to a handle. In a preferred embodiment, the crystal structures of the small area substrates are aligned to within 10 degrees or less of each other in the plane of the bonded interface. In the most preferred embodiment, the crystal structures of the small area substrates are aligned to within 1 degree or less of each other in the plane of the bonded interface.

In a preferred embodiment the crystal directions of the small wafers will be determined by the wafer manufacturer using x-ray diffraction. The wafers will then be shaped with a so-called orienting flat, a notch or any other geometric feature of the wafer which is aligned with a reference direction in the crystal to within some high tolerance (e.g. aligned to within 1 degree of the true crystal direction). In another embodiment the reference crystal direction in the small wafers will be determined by X-ray measurements of the individual small wafers. The reference direction can be indicated on the wafer by patterning the wafer with one or a combination of a lithographically defined pattern, and ink mark, tape, a mechanical scribe or a scribe formed with a laser. In another embodiment the reference crystal direction in the small wafers will be determined by cleaving the edge of the wafer in a direction parallel to a known cleavage plane of the crystal.

In a preferred embodiment the small wafers will be aligned for bonding by using a die bonding machine providing alignment accuracy to within tolerances of less than 20 microns. A die bonder could include an aligner/bonder system whereby a special jig is used in a contact aligner to align the small wafers to the handle and make the initial placement of the wafers and a dedicated bonding tool is used to create the final bond. In a less preferred embodiment alignment will be achieved by manipulating the small wafer by hands before introducing the wafer and handle to the final bonding process.

Each of the small wafers will provide a central good region and an edge exclusion region. A The edge exclusion region consists of that area near the edge of the wafer that is less uniform or otherwise of lesser quality than the material near the wafer center due to the presence of the wafer edge during epitaxy. The edge exclusion region also includes the area near the wafer edge where the photoresist thickness is not the same as for the bulk of the wafer surface; i.e. the so-called photo-resist edge bead. The edge bead is typically thicker than the resist layer over the majority of the wafer, and the difference in thickness will typically result in a difference in the quality of lithographic patterning for the material near the edge. If a portion of a row of laser diode devices overlaps the edge exclusion region then all of those devices are likely to be defective. Maximizing yield of useable devices requires alignment of the lithographic mask with the central good region such that a maximum number of devices are placed within the central good region.

In a preferred embodiment of the method a lithographic stepper will be used to pattern the wafers. The mask reticle size will be chosen such that the entirety of the central good region can be exposed using a whole number of exposures. The spacing between small area wafers will be chosen such that a whole number of exposures can be fit between the adjacent edges of the central good regions of adjacent small area wafers. In this way the lithography process can be aligned once to a key wafer and then exposures can be made automatically across many wafers with a maximum of devices patterned into the central good region of each individual wafer. In a less preferred embodiment of the method, a contact aligner is used to pattern the wafers. Here the mask is a continuous array of laser ridges and patterns. The spacing between wafers will be chosen such that the registry between the laser patterns and the edges of the central good region on one wafer is preserved for all other wafers bonded to the same handle.

In a specific embodiment, the method of facet formation includes subjecting the substrates to a laser or mechanical scribe after debonding from the handle wafers for pattern formation. In this embodiment, scribing and cleaving are consistent with the description given above for typical fabrication on GaN substrates.

In a specific embodiment, the method of facet formation includes subjecting the handle wafers to a laser or mechanical scribe for pattern formation with the small area wafers still bonded to the handle wafers. In a second embodiment, the handle wafers and the small area wafers will be scribed. In a preferred embodiment, the pattern is configured for the formation of a pair of facets for one or more ridge lasers. In a preferred embodiment, the pair of facets face each other and are in parallel alignment with each other.

In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the laser scribing can be performed on the back-side, front-side, or both of either or both of the handle wafer and small area substrates depending upon the application. Of course, there can be other variations, modifications, and alternatives. In a specific embodiment, the method uses backside laser scribing or the like. With backside laser scribing, the method preferably forms a continuous line laser scribe that is perpendicular to the laser bars on the backside of the handle wafer. In a specific embodiment, the laser scribe is generally 15-20 um deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on one or more of the facets. In a specific embodiment, backside laser scribe often requires that the substrates face down on the tape. With front-side laser scribing, the backside of the handle is in contact with the tape. Of course, there can be other variations, modifications, and alternatives. In a specific embodiment a laser nick cleave can be employed, where the laser scribe is produced only near the edge of the handle wafer. The scribe then acts as a nucleation point for a crack which propagates along natural cleavage planes of the handle wafer.

In a second embodiment, the method uses a mechanical scribe stylus tipped with diamond, SiC or some other acceptably hard material. In a specific embodiment, the scribe stylus is configured on a system, which allows for accurate scribe lines configured in one or more different patterns and profiles. In one or more embodiments, the laser scribing can be performed on the back-side, front-side, or both of either or both of the handle wafer and small area substrates depending upon the application. Of course, there can be other variations, modifications, and alternatives. In a specific embodiment, the method uses backside scribing or the like. With backside scribing, the method preferably forms a continuous line scribe that is perpendicular to the laser bars on the backside of the handle wafer. In a specific embodiment, the laser scribe is generally 15-20 um deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside scribing, however, may lead to residue from the tape on one or more of the facets. In a specific embodiment, backside scribing often requires that the substrates face down on the tape. With front-side scribing, the backside of the handle is in contact with the tape. Of course, there can be other variations, modifications, and alternatives. In a specific embodiment and nick cleave can be employed, where the scribe is produced only near the edge of the handle wafer. The scribe then acts as a nucleation point for a crack which propagates along natural cleavage planes of the handle wafer.

Example 1

Laser diode device structures are grown using MOCVD on nominally on-axis (10-10) oriented, rectangular GaN substrates with dimensions of 10 mm by 20 mm, where the projection of the [0001] direction in the plane of the primary surface of the substrates is aligned parallel to the 10 mm long edge and the in-plane [11-20] direction is parallel to the 20 mm long edge. The substrates are single side polished, with the non-epitaxial sides having an acid etched surface. The backsides of the substrate wafers are lapped to a mirror finish. A 3 inch diameter single-crystal (100) oriented silicon first handle wafer is patterned with photoresist using a lithographic process such that alignment marks are present on the first handle wafer surface. The alignment marks are designed to provide clear indication of the orientations of the in-plane <110> directions in the silicon wafer. A 250 nm thick gold bonding layer is then deposited on the handle wafer and the back-side of the small area GaN substrates using an e-beam evaporation process. The photoresist on the handle wafer is then stripped, leaving negative images of the alignment marks in the gold film. The GaN substrates are then aligned to the Si wafer using a die bonding machine.

The GaN wafers are aligned such that the in-plane projection of the [0001] direction of each GaN substrate is aligned to the same <110> direction to within 1 degree. The GaN wafers are bonded in a rectangular array, with the long and short edges of the wafers aligned parallel to the two displacement vectors of the array. In this case, the edge exclusion region is 1 mm in width. The GaN wafers are placed and bonded as shown in FIG. 7 and FIG. 8A, with long and short edges of the GaN wafers parallel and with the gold bonding layers of both the first handle and the GaN wafers in contact. The stepper mask projected area is 4 mm×9 mm, such that 4 exposures can cover the full area inside the boundary of the edge exclusion region. The GaN wafers are spaced with 2 mm between long edges and 7 mm between short edges with tolerance of 30 microns, such that one exposure with the mask will span the distance between good regions on adjacent GaN wafers. The initial bond is carried out in the die bonder, with each GaN wafer bonded at greater than 300 degrees Celsius immediately after alignment and placement. In some embodiments a subsequent bonding step is used where the ensemble of GaN wafers are held at temperatures above 300 degrees Celsius and at elevated pressures in order to strengthen the gold-gold bond.

The GaN wafer top-side processes are then carried out in order to fabricated laser ridges, layers of passivating dielectric, deposition of metal electrical contacts and deposition of metal bond pads for wire-bonding of the final laser diode die during packaging. At this point any front-side laser scribing required for facet cleaving or die-singulation is carried out. Photo-resist is spun onto the entire composite wafer. Edge bead at the edges of the small GaN wafers is avoided by using projection lithography with a stepper. In processing steps that might damage the bonding medium, for example in this case were there a processing step involving gold etchant, then a protective layer of photoresist could be created using contact lithography around the edge of each wafer to isolate the bonded interface from any chemicals or etch processes. Here, the same photoresist could be used to both pattern the GaN wafers with projection lithography and protect the bonding medium using contact lithography.

The GaN wafers are then transferred to a second handle wafer for backside processing as shown in FIG. 8B. A 3 inch diameter single-crystal [100] oriented silicon second handle wafer is produced. A mixture of dissolved, commercially available adhesive wax (in this case Crystalbond 509) is produced from dissolution of 1 part Crystalbond in 4 parts acetone. This dissolved wax is then spun onto the second handle wafer at greater than 1000 RPM using a commercially available wafer spinner as one would do for spinning on photoresist. The acetone is then evaporated in a two-step process, first for 10 minutes are room temperature and then for 2 minutes at 80 degrees Celsius.

The first and second handles are then arranged using a jig such that the orienting flats are aligned and the crystallographic directions of the small area GaN wafers are aligned with the correct directions of the second handle. The unbonded surfaces of the GaN wafers are then brought into contact with the Crystalbond on the second handle. While under contact the wafers are heated to 120-130 degrees Celsius to melt the Crystalbond and adhere the GaN wafers to the second handle.

The first handle is then removed using a lapping process. Once the first handle is fully removed the small area GaN wafers are thinned as an ensemble, while bonded to the second handle, using a similar lapping process. The GaN wafers are thinned to approximately 100 microns in thickness. The GaN backside processing steps are then carried out in order to form n-type electrical contacts as well as fabrication of any back-side laser scribes required for the facet cleaving and die-singulation processes. The resulting structure is similar to that shown in FIG. 8C.

The small area GaN wafers are then debonded from the second handle, either mechanically after melting the wax adhesive, or chemically by dissolving the wax adhesive in solvent. After cleaning to remove any wax residue, the wafers are cleaved into bars while at the same time forming the front and back facet of the laser cavities. The bars are then stacked and depending on the application reflective and antireflective coatings are deposited on the facets. The bars are then singulated using cleaving into individual laser diode die.

Example 2

Laser diode device structures are grown using MOCVD on nominally on-axis (10-10) oriented, rectangular GaN substrates with dimensions of 10 mm by 20 mm, where the projection of the [0001] direction in the plane of the primary surface of the substrates is aligned parallel to the 10 mm long edge and the in-plane [11-20] direction is parallel to the 20 mm long edge. The substrates are single side polished, with the non-epitaxial sides having an acid etched surface. The GaN substrates are cleaned chemically with acids and solvents to remove any surface contamination, and then top-side, cladding and electrical-contact layers are overlaid on the epitaxial-side of the GaN substrates using a blanket e-beam deposition process. After the contact layer deposition, a blanket 250 nm thick gold bond layer is overlaid on the contact layers. A 3 inch diameter single-crystal (100) oriented GaAs first handle wafer is patterned with photoresist using a lithographic process such that alignment marks are present on the first handle wafer surface. The alignment marks are designed to provide clear indication of the orientations of the in-plane <110> directions in the GaAs wafer. A 250 nm thick gold bonding layer is then deposited on the handle wafer using an e-beam evaporation process. The photoresist on the handle wafer is then stripped, leaving negative images of the alignment marks in the gold film. The GaN substrates are then aligned to the Si wafer using a die bonding machine.

The GaN wafers are aligned such that the in-plane projection of the [0001] direction of each GaN substrate is aligned to the same <110> direction to within 1 degree. The GaN wafers are bonded in a rectangular array, with the long and short edges of the wafers aligned parallel to the two displacement vectors of the array. In this case, the edge exclusion region is 1 mm in width. The GaN wafers are placed and bonded as shown in FIG. 7, with long and short edges of the GaN wafers parallel and with the gold bonding layers of both the first handle and the GaN wafers in contact. The stepper mask projected area is 4 mm×9 mm, such that 4 exposures can cover the full area inside the boundary of the edge exclusion region. The GaN wafers are spaced with 2 mm between long edges and 7 mm between short edges with tolerance of 30 microns, such that one exposure with the mask will span the distance between good regions on adjacent GaN wafers. The initial bond is carried out in the die bonder, with each GaN wafer bonded at greater than 300 degrees Celsius immediately after alignment and placement. In some embodiments a subsequent bonding step is used where the ensemble of GaN wafers are held at temperatures above 300 degrees Celsius and at elevated pressures in order to strengthen the gold-gold bond.

The GaN wafer back-side processes are then carried out. The GaN wafers are thinned considerably using a one or more techniques of lapping, physical and chemical (wet or dry) etches. After GaN substrate thinning, laser structures are fabricated by the formation of laser ridges, overlaying of layers of passivating dielectric, deposition of metal electrical contacts and deposition of metal bond pads for wire-bonding of the final laser diode die during packaging. Edge bead at the edges of the small GaN wafers is avoided by using projection lithography with a stepper. In processing steps that might damage the bonding medium, for example in this case were there a processing step involving gold etchant, then a protective layer of photoresist could be created using contact lithography around the edge of each wafer to isolate the bonded interface from any chemicals or etch processes. Here, the same photoresist could be used to both pattern the GaN wafers with projection lithography and protect the bonding medium using contact lithography. The GaN wafers are then bonded to a second handle. An adhesive wax (e.g. Crystalbond 509) can be used. In this process alignment to the second handle is not important. The second handle need only support the composite wafer during thinning of the first handle.

Once bonded to the second handle wafer, the first handle is then thinned using a lapping process to a thickness of approximately 100 micrometers. The GaN wafers and first handle are then debonded from the second handle, either mechanically after melting the wax adhesive, or chemically by dissolving the wax adhesive in solvent. After cleaning to remove any wax residue, the first handle-GaN substrate composite wafer is then cleaved into composite bars while at the same time forming the front and back facets of the laser device cavities. This process is detailed in FIG. 6. The first handle is cleaved (FIG. 6A) to form a rectangular piece that bounds the thinned GaN wafers. The first handle is then cleaved (FIG. 6B) parallel to the handle [110] which is parallel to the GaN in-plane [11-20] direction. The cleave locations are chosen to align with the previously patterned contact pads and laser device ridges. The composite bars are then stacked and, depending on the application, reflective and anti-reflective coatings are applied to the front and back facets. The bars are then singulated using cleaving into individual laser diode die.

Example 3

Laser diode device structures are grown using MOCVD on nominally on-axis (10-10) oriented, rectangular GaN substrates with dimensions of 10 mm by 20 mm, where the projection of the [0001] direction in the plane of the primary surface of the substrates is aligned parallel to the 10 mm long edge and the in-plane [11-20] direction is parallel to the 20 mm long edge. The substrates are single side polished, with the non-epitaxial sides having an acid etched surface. The GaN substrates are cleaned chemically with acids and solvents to remove any surface contamination, and then top-side, cladding and electrical-contact layers are overlaid on the epitaxial-side of the GaN substrates using a blanket e-beam deposition process. After the contact layer deposition, a blanket 250 nm thick gold bond layer is overlaid on the contact layers. A 3 inch diameter single-crystal (100) oriented GaAs first handle wafer is patterned with photoresist using a lithographic process such that alignment marks are present on the first handle wafer surface. The alignment marks are designed to provide clear indication of the orientations of the in-plane <110> directions in the GaAs wafer. A 250 nm thick gold bonding layer is then deposited on the handle wafer using an e-beam evaporation process. The photoresist on the handle wafer is then stripped, leaving negative images of the alignment marks in the gold film. The GaN substrates are then aligned to the Si wafer using a die bonding machine.

The GaN wafers are aligned such that the in-plane projection of the [0001] direction of each GaN substrate is aligned to the same <110> direction to within 5 degrees. The GaN wafers are bonded in a rectangular array, with the long and short edges of the wafers aligned parallel to the two displacement vectors of the array. In this case, the edge exclusion region is 1 mm in width. The GaN wafers are placed and bonded as shown in FIG. 7, with long and short edges of the GaN wafers parallel and with the gold bonding layers of both the first handle and the GaN wafers in contact. The stepper mask projected area is 4 mm×9 mm, such that 4 exposures can cover the full area inside the boundary of the edge exclusion region. The GaN wafers are spaced with 2 mm between long edges and 7 mm between short edges with tolerance of 30 microns, such that one exposure with the mask will span the distance between good regions on adjacent GaN wafers. The initial bond is carried out in the die bonder, with each GaN wafer bonded at greater than 300 degrees Celsius immediately after alignment and placement. In some embodiments a subsequent bonding step is used where the ensemble of GaN wafers are held at temperatures above 300 degrees Celsius and at elevated pressures in order to strengthen the gold-gold bond.

The GaN wafer back-side processes are then carried out. The GaN wafers are thinned considerably using a one or more techniques of lapping, physical and chemical (wet or dry) etches. After GaN substrate thinning, laser structures are fabricated by the formation of laser ridges, overlaying of layers of passivating dielectric, deposition of metal electrical contacts and deposition of metal bond pads for wire-bonding of the final laser diode die during packaging. It is during this backside processing, after thinning, that the laser ridge facets are formed using a dry etch method such as reactive ion etching, inductively coupled plasma etching, chemically assisted ion beam etching or the like. Reflective and anti-reflective coatings are deposited on the front and back facets of the ridge if required by the particular application. Temporary protective layers, for example ones consisting of photoresist, may be applied to the etched facets to protect them from damage or contamination during subsequent processing steps.

The GaN wafers are then bonded to a second handle. An adhesive wax (e.g. Crystalbond 509) can be used. In this process alignment to the second handle is not important. The second handle need only support the composite wafer during thinning of the first handle.

Once bonded to the second handle wafer, the first handle is then thinned using a lapping process to a thickness of approximately 100 micrometers. The GaN wafers and first handle are then debonded from the second handle, either mechanically after melting the wax adhesive, or chemically by dissolving the wax adhesive in solvent. After cleaning to remove any wax residue, the first handle-GaN substrate composite wafer is then cleaved into composite bars in a process similar to that detailed in FIG. 6. The first handle is cleaved (FIG. 6A) to form a rectangular piece that bounds the thinned GaN wafers. The first handle is then cleaved (FIG. 6B) parallel to the handle [110] which is parallel to the GaN in-plane [11-20] direction. The cleave locations are chosen to align with the previously patterned contact pads and laser device ridges, producing cleaves that run between the etched facets of the first and second ends of the laser ridges. The bars are then singulated using cleaving into individual laser diode die.

In an example, the present invention provides a method for manufacturing a laser diode device from a plurality of gallium and nitrogen containing semiconductor substrates, e.g., GaN. Each of the gallium and nitrogen containing semiconductor substrates ("substrates") has a plurality of epitaxially grown layers overlaying a top-side of each of the substrates. The method includes determining an orientation of a reference crystal direction for each of the substrates. The method includes aligning at least one of the substrates to a spatial region configured in a selected direction of a first handle substrate, which has a larger spatial region than a sum of a total backside region of plurality of the substrates to be arranged in a tiled configuration overlying the first handle substrate, such that the reference crystal direction for the substrate is parallel to the spatial region in the selected direction within 10 degrees or less, although there can be other orientations. In an example, the method includes mating a backside region of the substrate, which has been aligned, to a portion of a surface region of the first handle substrate. In an example, the method includes bonding the substrate to portion of the surface region of the first handle substrate using a first bonding medium provided between the first handle substrate and the substrate while maintaining the alignment between reference crystal orientation and the selected direction of the first handle substrate. In an example, the method includes repeating the aligning, mating, and bonding for all of the other plurality of substrates to form an array of substrates spatially disposed on the surface region of the first handle substrate in the tiled arrangement.

In other examples, the reference crystal direction for each of the substrates is substantially parallel to within 5 degrees or less, parallel to within 3 degrees or less, or parallel to within 1 degree or less to the spatial region configured in the selected direction. In an example, the reference crystal direction orientation is provided by cleaving the substrate to expose the reference crystal direction, is provided by X-ray diffraction, or is provided by an orienting flat or otherwise from a determined shape of a portion of the substrate or other suitable techniques.

In an example, the first handle substrate is patterned with one or more alignment marks or discontinuous regions of bonding media configured to align the spatial region to each of the substrates. In an example, after bonding each of the substrates with the first handle substrate, the method processing each of the substrates, concurrently, by forming ridges or some other means of inducing lateral optical mode confinement to form a laser stripe. In an example, the method includes after bonding each of the substrates with the first handle substrate, processing each of the substrates, concurrently, by forming dielectric passivation layers. In an example, after bonding each of the substrates with the first handle substrate, the method includes processing each of the substrates, concurrently, by forming metal contacts and/or forming metal bond pads to the p-type and/or n-type gallium and nitrogen containing layers. In an example, after bonding each of the substrates with the first handle substrate, the method includes processing each of the substrates, concurrently, by thinning the gallium and nitrogen containing substrates via lapping or chemical etching. In other examples, any of the above combinations, and variations can be included. By way of the concurrent processing, efficiency and consistency is achieved.

In an example, the method further makes use of a second handle substrate, as well as others. In an example, the method comprises bonding a second handle substrate using a second bonding medium to an upper region of each of the substrates to sandwich each of the substrates between the first handle substrate and the second handle substrate. The method includes bonding a second handle substrate using a second bonding medium to an upper region of each of the substrates to sandwich each of the substrates between the first handle substrate and the second handle substrate; and removing the first handle substrate from each of the substrates while the second handle substrate remains attached to each of the substrates; wherein removing the first handle substrate is selected from a process including one of laser lift-off, a mechanical grinding or lapping, a chemical etching of the first handle substrate or a chemical etching or dissolution of the first bonding medium provided between the first handle substrate and each of the substrates.

In an example, the method includes thinning a backside region of each of the substrates using any combination of a mechanical lapping and polishing, chemical etching and physical etching, or other process. In an example, the method includes bonding a second handle substrate using a second bonding medium to an upper region of each of the substrates to sandwich each of the substrates between the first handle substrate and the second handle substrate; and processing each of the exposed backside regions of each of the substrates, while being attached to the second handle substrate, to one or more processes for at least one of metal contacts, bond pads and/or dielectric passivation layers.

In an example, the method includes bonding a second handle substrate using a second bonding medium to an upper region of each of the substrates to sandwich each of the substrates between the first handle substrate and the second handle substrate; and removing each of the substrates and forming at least a pair of cleaved regions to form a pair of facets, which are opposite of each other, using a cleaving process on each of the substrates. In an example, the method includes bonding a second handle substrate using a second bonding medium to an upper region of each of the substrates to sandwich each of the substrates between the first handle substrate and the second handle substrate; and forming at least a pair of cleaved region to form a pair of facets, which are opposite of each other, using a cleaving process while a portion of the second handle substrate remains attached to a laser diode bar.

In an example, the method includes after bonding each of the substrates with the first handle substrate, processing each of the substrates, concurrently, by forming a thickness of dielectric passivation material overlying each of the substrates, and further comprising bonding each of the substrates to a third handle substrate using a third bonding medium with a third bonding medium located between the third handle wafer and the substrates. In an example, the method includes bonding a second handle substrate using a second bonding medium to an upper region of each of the substrates to sandwich each of the substrates between the first handle substrate and the second handle substrate; and forming at least a pair of cleaved region to form a pair of facets, which are opposite of each other, using a cleaving process while a portion of the second handle substrate remains attached to a laser diode bar; and thereafter removing the second handle substrate using at least one of a laser lift-off, mechanical grinding or lapping, chemical etching of the second handle substrate or chemical etching or dissolution of the second bonding medium provided on the second handle substrate.

In an example, the method includes bonding each of the substrates to a third handle substrate; and forming a pair of cleaved region to form facets, which are opposite of each other by cleaving the third handle substrate to yield a composite laser diode bar comprising the third handle substrate portion bonded to one or more arrays of laser diode devices. The method includes forming a pair of facets, which are opposite of each other, by an etching process selected from at least one of reactive ion etching (RIE), chemical assisted ion beam etching (CAIBE), or inductively coupled plasma etching (ICP).

In an example, the present invention includes a method for manufacturing a laser diode device from a plurality of gallium and nitrogen containing semiconductor substrates. Each of the gallium and nitrogen containing semiconductor substrates ("substrates") has a plurality of epitaxially grown layers overlaying a top-side of each of the substrates. The method includes determining an orientation of a reference crystal direction for each of the substrates; and aligning at least one of the substrates to a spatial region configured in a selected direction of a first handle substrate, having a larger spatial region than a sum of a total backside region of plurality of the substrates, such that the reference crystal direction for the substrate is parallel to the spatial region in the selected direction within 15 degrees or less, although there can be variations. The method includes mating a backside region of the substrates, which has been aligned, to a portion of a surface region of the first handle substrate. The method includes bonding the substrate to portion of the surface region of the first handle substrate using a first bonding medium provided between the first handle substrate and the substrate while maintaining the alignment between reference crystal orientation and the selected direction of the first handle substrate. The method includes repeating the aligning, mating, and bonding for all of the other plurality of substrates to form an array of substrates spatially disposed on the surface region of the first handle substrate. The method includes forming at least a pair of facets, which are opposite of each other, on each of the substrates using an etching process selected from at least one of reactive ion etching (RIE), chemical assisted ion beam etching (CAIBE), or inductively coupled plasma etching (ICP).

In an example, the present invention provides a gallium and nitrogen containing multilayered structure. The structure has a plurality of gallium and nitrogen containing semiconductor substrates, each of the gallium and nitrogen containing semiconductor substrates ("substrates") having a plurality of epitaxially grown layers overlaying a top-side of each of the substrates. The structure has an orientation of a reference crystal direction for each of the substrates. The structure has a first handle substrate coupled to each of the substrates such that each of the substrates is aligned to a spatial region configured in a selected direction of the first handle substrate, which has a larger spatial region than a sum of a total backside region of plurality of the substrates to be arranged in a tiled configuration overlying the first handle substrate. The reference crystal direction for each of the substrates is parallel to the spatial region in the selected direction within 10 degrees or less. The structure has a first bonding medium provided between the first handle substrate and each of the substrate while maintaining the alignment between reference crystal orientation and the selected direction of the first handle substrate; and a processed region formed overlying each of the substrates configured concurrently while being bonded to the first handle substrate. Depending upon the embodiment, the processed region can include any combination of the aforementioned processing steps and/or steps.

While the above is a full description of the specific embodiments, various modifications, alternative constructions and equivalents may be used. Therefore, the above description and illustrations should not be taken as limiting the scope of the present invention which is defined by the appended claims.

The invention claimed is:

1. A gallium and nitrogen containing structure comprising:
   a plurality of $\{11\text{-}20\}$, $\{10\text{-}10\}$, $\{10\text{-}11\}$, $\{20\text{-}21\}$ or $\{30\text{-}31\}$ oriented gallium and nitrogen containing semiconductor substrates, each of the plurality of gallium and nitrogen containing semiconductor substrates having one or more epitaxially grown layers;
   a first handle substrate having a having a bonding surface with larger area than the sum of the areas of the bonding surfaces of the plurality of the gallium and nitrogen containing substrates, wherein each of the plurality of gallium and nitrogen containing semiconductor substrates are coupled to the first handle substrate, the plurality of gallium and nitrogen containing semiconductor substrates are arranged in a tiled configuration overlying the first handle substrate, and the orientations of a reference crystal direction for each of the plurality of gallium and nitrogen containing semiconductor substrates are parallel to within 10 degrees or less;
   a first bonding medium provided between the first handle substrate and each of the plurality of gallium and nitrogen containing semiconductor substrates.

2. The structure of claim 1 wherein a processed region is formed overlying each of the plurality of gallium and nitrogen containing semiconductor substrates bonded to the first handle substrate.

3. The structure of claim 1 wherein the first bonding medium comprises a dielectric oxygen or nitrogen containing material.

4. The structure of claim 1 wherein the reference crystal direction for each of the plurality of gallium and nitrogen containing semiconductor substrates are parallel to within 10 degrees or less of a selected crystal direction of the first handle substrate.

5. The structure of claim 1 wherein gallium and nitrogen containing semiconductor substrates having a thickness less than 50 micrometers.

\* \* \* \* \*